United States Patent
Shinoda et al.

(10) Patent No.: US 9,209,519 B2
(45) Date of Patent: Dec. 8, 2015

(54) ELECTROMAGNETIC WAVE PROPAGATION APPARATUS AND ELECTROMAGNETIC WAVE INTERFACE

(75) Inventors: Hiroshi Shinoda, Kodaira (JP); Takahide Terada, Tokyo (JP); Kazunori Hara, Kunitachi (JP)

(73) Assignee: HITACHI, LTD., Tokyo (JP)

( * ) Notice: Subject to any disclaimer, the term of this patent is extended or adjusted under 35 U.S.C. 154(b) by 780 days.

(21) Appl. No.: 13/548,026

(22) Filed: Jul. 12, 2012

(65) Prior Publication Data
US 2013/0014981 A1 Jan. 17, 2013

(30) Foreign Application Priority Data
Jul. 12, 2011 (JP) ................... 2011-153876

(51) Int. Cl.
*H01Q 9/04* (2006.01)
*H05K 1/02* (2006.01)

(52) U.S. Cl.
CPC ............ *H01Q 9/0435* (2013.01); *H05K 1/0237* (2013.01)

(58) Field of Classification Search
CPC ....................... H01Q 9/0435; H05K 1/0237
USPC .................................................. 174/250, 267
See application file for complete search history.

(56) References Cited

U.S. PATENT DOCUMENTS

| | | | | |
|---|---|---|---|---|
| 5,581,266 A | * | 12/1996 | Peng et al. | 343/770 |
| 6,160,513 A | * | 12/2000 | Davidson et al. | 343/700 MS |
| 7,202,818 B2 | * | 4/2007 | Anguera Pros et al. | 343/700 MS |
| 7,271,777 B2 | * | 9/2007 | Yuanzhu | 343/767 |
| 7,333,067 B2 | * | 2/2008 | Hung et al. | 343/770 |
| 7,342,553 B2 | * | 3/2008 | Soler Castany et al. | 343/853 |
| 7,724,203 B2 | * | 5/2010 | Shinoda et al. | 343/897 |
| 8,421,692 B2 | * | 4/2013 | Stoneback et al. | 343/705 |
| 8,983,370 B2 | * | 3/2015 | Tsukagoshi et al. | 455/39 |
| 2004/0005889 A1 | * | 1/2004 | Nishimura et al. | 455/423 |
| 2012/0223142 A1 | * | 9/2012 | Wang et al. | 235/462.25 |
| 2014/0103724 A1 | * | 4/2014 | Wagoner | 307/44 |

FOREIGN PATENT DOCUMENTS

| | | |
|---|---|---|
| JP | 2009-188737 A | 8/2009 |
| JP | 2010-093446 A | 4/2010 |

* cited by examiner

*Primary Examiner* — Rexford Barnie
*Assistant Examiner* — Elim Ortiz
(74) *Attorney, Agent, or Firm* — Miles & Stockbridge P.C.

(57) ABSTRACT

An electromagnetic wave propagation apparatus has a planar propagation medium including a planar conductor, a first planar dielectric, a planar mesh conductor, and a second planar dielectric being overlaid on each other in order; at least one electromagnetic wave input port for the planar propagation; a power supply station that supplies the planar propagation medium with an electromagnetic wave via at least one electromagnetic wave input port; and at least one power receiving apparatus for a second planar dielectric of the planar propagation medium that includes an electromagnetic wave interface and a power receiving circuit. A dielectric board has multiple conductor patterns as the electromagnetic wave interface. At least one connection means is between the conductor pattern and the power receiving circuit. At least one short-circuit means between the conductor patterns is at an end of the conductor pattern.

18 Claims, 19 Drawing Sheets

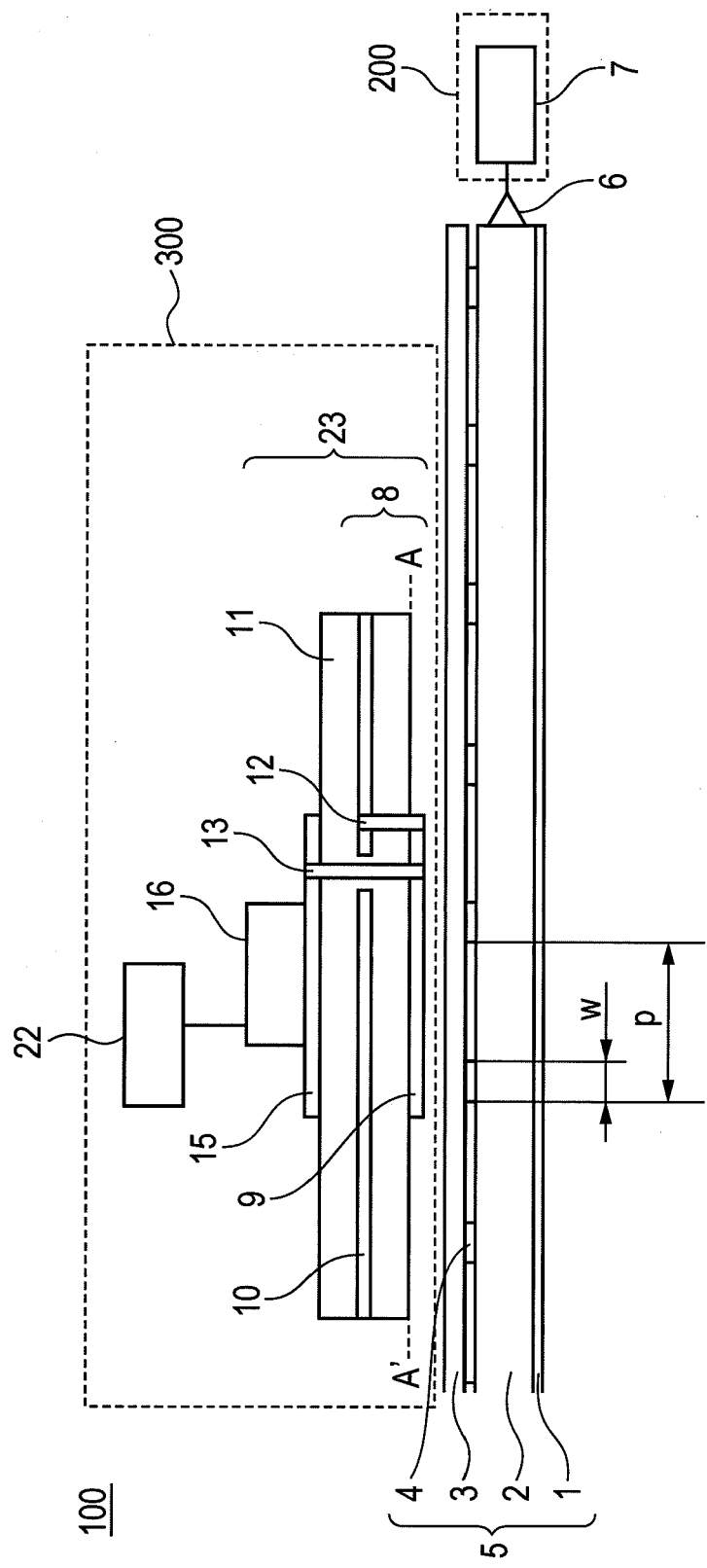

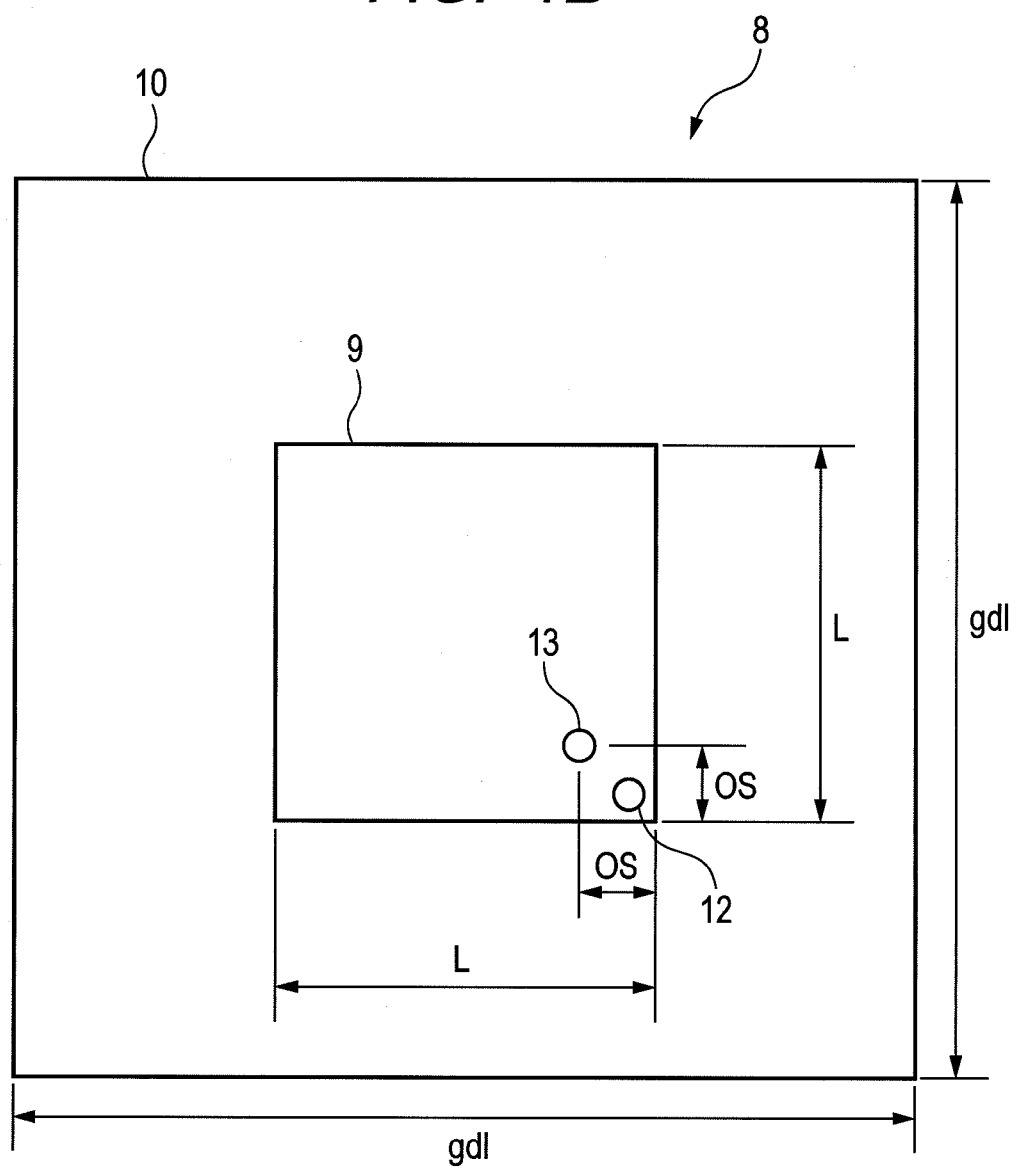

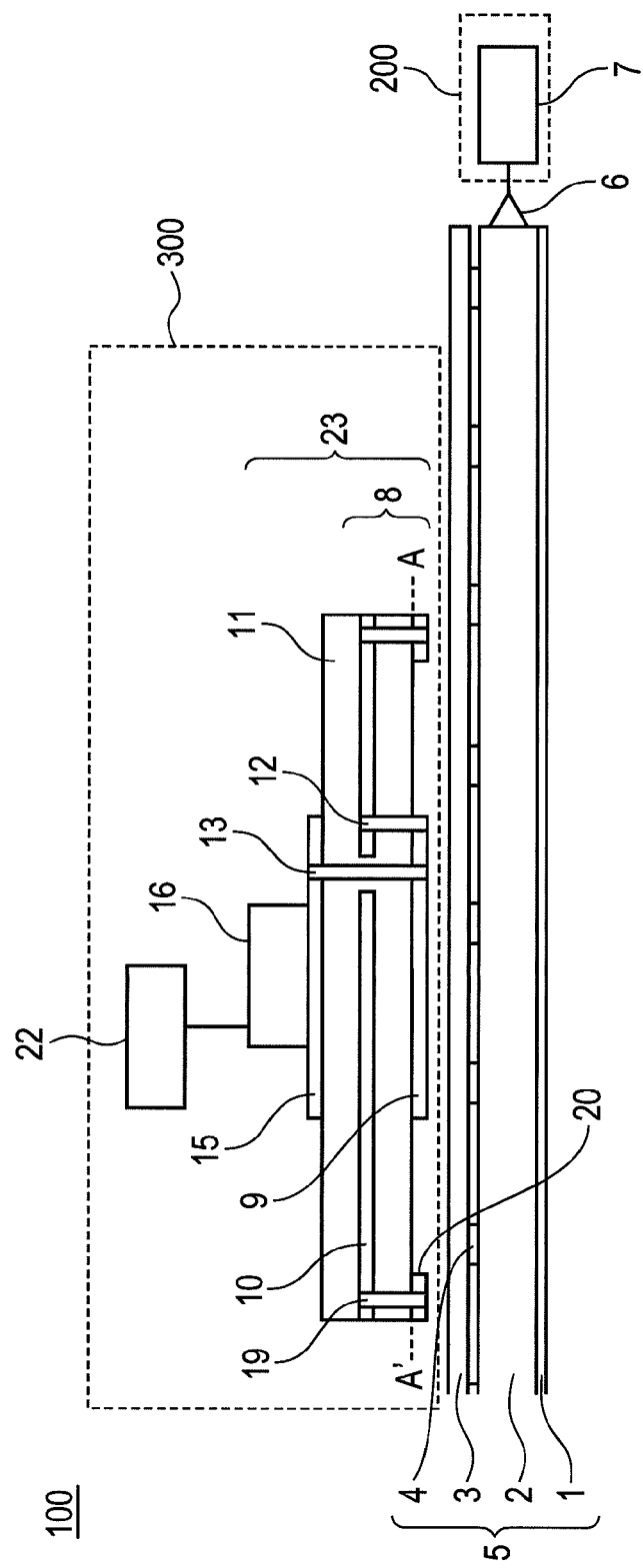

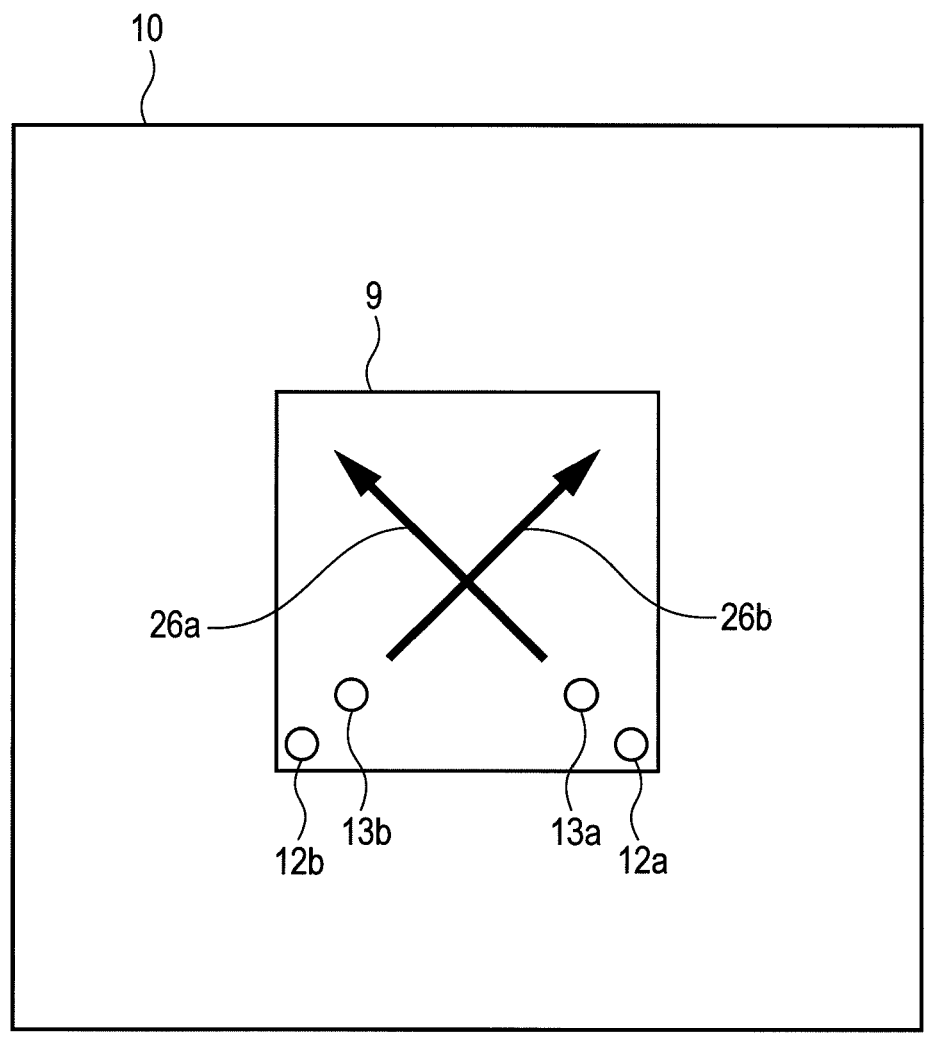

ELECTROMAGNETIC WAVE PROPAGATION APPARATUS AND ELECTROMAGNETIC WAVE INTERFACE

CLAIM OF PRIORITY

The present application claims priority from Japanese patent application JP 2011-153876 filed on Jul. 12, 2011, the content of which is hereby incorporated by reference into this application.

FIELD

The present invention relates to an electromagnetic wave propagation apparatus and an electromagnetic wave interface. More particularly, the invention relates to an electromagnetic wave propagation apparatus using a planar propagation medium to propagate an electromagnetic wave in two dimensions and an electromagnetic wave interface used for this apparatus.

BACKGROUND

In recent years, there is an increasing demand for networking electronic units in many fields including consumer electronics and society's infrastructure. The number of cables connecting between units tends to increase. On the other hand, the trend toward wireless continues in fields such as data transmission, for example, wireless LAN (Local Area Network). There is also an increasing demand for wireless supply of power. However, the wireless power supply technology is commercially available only for IH cooking heaters, shavers, and cordless telephones. Such supplies transmit power at very short distances, almost in a contacted state. Degraded transmission efficiency due to radio wave diffusion inhibits three-dimensional power transmission when dealing with distances of several meters or power levels of several watts or more. The rate of adoption of wireless power supply technology remains stagnant. Incorrect positioning greatly degrades characteristics of an electronic unit utilizing a commercially available wireless power supply. The electronic unit needs to be placed at a specified position with limited freedom for placement.

For example, Japanese Unexamined Patent Application Publication No. 2010-093446 discloses the planar propagation medium as a technology to solve these problems. The technology can transmit an electromagnetic wave between two planar conductors that sandwich a planar dielectric. One of the planar conductors is formed in a meshed pattern. The electromagnetic wave interface is provided via a thin-film dielectric. An evanescent wave leaking near the meshed conductor enables output and input of an electromagnetic wave. The same publication discloses a surface wave transmission system that propagates an electromagnetic wave (referred to as a surface wave) trapped in a planar propagation medium. This system two-dimensionally transmits power along the planar propagation medium and enables higher efficiency than three-dimensional transmission. Just placing a device to be powered on the planar propagation medium enables power transmission. The system ensures a high degree of freedom for placement and may serve as continuous power supply for mobile devices.

Japanese Unexamined Patent Application Publication No. 2009-188737 discloses the technology of miniaturizing an ordinary antenna used in free space. Dipole antennas are modified to provide two L-shaped dipole antennas. These antennas are symmetrically placed at opposite corners on a conductive plate. A power supply point is provided at the end of a signal conductor for each antenna.

Japanese Unexamined Patent Application Publication No. 2010-093446 uses electromagnetic wave coupling. Therefore, the size of an electromagnetic wave interface depends on wavelengths in the planar propagation medium and tends to increase. To solve this problem, the same publication discloses coupling a spiral conductor for the electromagnetic wave interface and a meshed conductor for the planar propagation medium using mutual inductance (M) between them. The distance between both conductors can be shortened, and the electromagnetic wave interface can be minimized without decreasing the mutual inductance. However, the mutual inductance varies due to the relative positions of the spiral conductor with respect to the meshed conductor, such that the power receiving amount is unstable. The technology disclosed in Japanese Unexamined Patent Application Publication No. 2010-093446 is not applicable for providing continuous power to mobile device where the positional dependence of power supply characteristics is important. For the purpose of positional dependence improvement or miniaturization, shortening a distance (Im) between lines on the spiral conductor causes additional problems, such as a decreased self-resonant frequency due to increased parasitic capacitance.

The miniaturization technology described in Japanese Unexamined Patent Application Publication No. 2009-188737 provides a planar antenna using two L-shaped dipole antennas placed opposite each other. The power is supplied from the center of the L-shaped dipole antennas. Theoretically, the miniaturization is limited to approximately a quarter wavelength. The linear antenna narrows an operating frequency band. The antenna cannot be easily miniaturized in combination with a power receiving circuit including a rectifier and a regulator.

SUMMARY

The present invention has been made in consideration of the foregoing. It is therefore an object of the invention to provide a small-sized electromagnetic wave interface and an electromagnetic wave propagation apparatus using the same so that the electromagnetic wave interface can be used for a surface wave transmission system, has power supply characteristics with a small dependence on position, and can supply power continuously to a mobile device.

An electromagnetic wave propagation apparatus according to the invention propagates an electromagnetic wave as electric power or data between a base station and a terminal. The electromagnetic wave propagation apparatus includes: a planar propagation medium including a planar conductor, a first planar dielectric, a planar mesh conductor, and a second planar dielectric that are stacked on each other in order; at least one electromagnetic wave input port that functions as a first interface to connect the base station with the planar propagation medium; and an electromagnetic wave interface that is provided on the second planar dielectric and functions as a second interface to connect the terminal with the planar propagation medium. The electromagnetic wave interface includes a planar dielectric board having a plurality of planar conductor patterns disposed in parallel therein so as to sandwich portions of the dielectric board between adjacent ones of the conductor patterns. The conductor patterns include a first conductor pattern that is disposed adjacent to the planar propagation medium. The first conductor pattern has a corner in plan view. At least one connection is provided between the first conductor pattern and the terminal. At least another connection is provided to electrically connect the conductor patterns at said corner of the first conductor pattern.

Aspects of the invention can decrease the dependence of power supply characteristics on position for wireless supply of power.

BRIEF DESCRIPTION OF THE DRAWINGS

FIG. 1A is a vertical sectional view showing a configuration of an electromagnetic wave propagation apparatus according to a first embodiment of the invention;

FIG. 1B shows a plane A-A' of FIG. 1A viewed from a planar propagation medium that contacts with a power receiving apparatus on the plane A-A';

FIG. 9A is a vertical sectional view showing a configuration of an electromagnetic wave propagation apparatus according to a second embodiment of the invention;

FIG. 10B shows a plane A-A' of FIG. 10A viewed from a planar propagation medium that contacts with a power receiving apparatus on the plane A-A';

DETAILED DESCRIPTION

Figure 2:
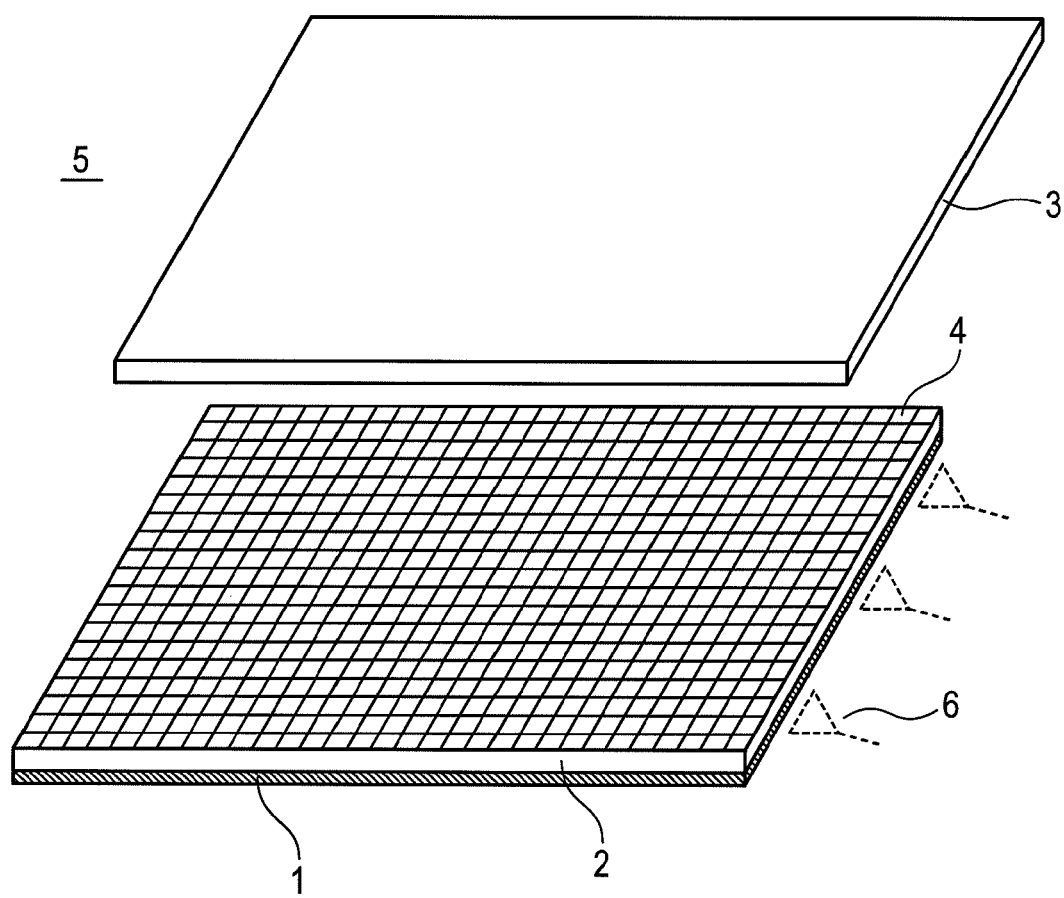
FIG. 2 is a perspective view of a planar propagation medium according to the first embodiment.

According to a representative embodiment of the invention, an electromagnetic wave propagation apparatus includes: a planar propagation medium including a planar conductor, a first planar dielectric, a planar mesh conductor, and a second planar dielectric that are overlaid on each other in order; at least one electromagnetic wave input port provided for the planar propagation medium; a power supply station (base station) that supplies the planar propagation medium with an electromagnetic wave as electric power or data through the electromagnetic wave input port; and at least one power receiving apparatus that is provided for a second planar dielectric of the planar propagation medium and includes an electromagnetic wave interface and a power receiving circuit. A dielectric board is provided with multiple conductor patterns as the electromagnetic wave interface. At least one connection means is provided between the conductor pattern and the power receiving circuit. At least one short-circuit means between the conductor patterns is provided at a corner of the conductor pattern. The electromagnetic wave propagation apparatus can use a small-sized electromagnetic wave interface that is used for a surface wave transmission system, has power supply characteristics that have a small dependence on position, and can supply continuous power to a mobile device. In particular, a dielectric area occupancy can adjust the power receiving amount. The dielectric area occupancy refers to the occupancy of an area containing the exposed dielectric and without the planar mesh conductor in an area of the planar propagation medium covered by the electromagnetic wave interface. The positional dependence of the power receiving amount can be decreased if the planar mesh conductor is shaped so as to decrease a variation in the dielectric area occupancy. In addition, the electromagnetic wave propagation apparatus is capable of wide-band operation.

According to another feature of the electromagnetic wave propagation apparatus, the conductor patterns include: a first conductor pattern provided toward the planar propagation medium; and a second conductor pattern provided nearer to the power receiving apparatus than the first conductor pattern. At least one through via is provided as a connection means between the first conductor pattern and the power receiving circuit. At least one short via is provided as a short-circuit means between the first conductor pattern and the second conductor pattern at an end of the first conductor pattern. According to the electromagnetic wave propagation apparatus, the electromagnetic wave interface can be manufactured by a general-purpose substrate forming process using a glass-epoxy printed substrate. As a result, the wireless power supply system can be provided inexpensively.

According to still another feature of the electromagnetic wave propagation apparatus, the outline of the second conductor pattern covers the outline of the first conductor pattern when the electromagnetic wave propagation apparatus is viewed in a direction perpendicular to the dielectric. The electromagnetic wave propagation apparatus can provide the electromagnetic wave interface with a large ground area to ensure stable operation.

According to yet another feature of the electromagnetic wave propagation apparatus, the short via is provided at the corner of the first conductor pattern. The electromagnetic wave propagation apparatus short-circuits one end face of the first conductor pattern and decreases a resonant frequency for the electromagnetic wave interface. As a result, the electromagnetic wave interface can be miniaturized.

According to still yet another feature of the electromagnetic wave propagation apparatus, the through via is provided along the diagonal including the corner of the first square conductor pattern provided with the short via. According to the electromagnetic wave propagation apparatus, the through via can elongate the current path on the first conductor pattern and decrease a resonant frequency for the electromagnetic wave interface. As a result, the electromagnetic wave interface can be miniaturized.

According to another feature of the electromagnetic wave propagation apparatus, multiple through vias provided at the different corners outside a diagonal of the first conductor pattern each produce reception power, and the power receiving circuit synthesizes the reception powers supplied with a given phase difference. The electromagnetic wave propagation apparatus can apply a given phase difference to reception powers acquired at multiple through vias and synthesize the reception powers to decrease directionality of the electromagnetic wave interface. Alternatively, the electromagnetic wave propagation apparatus can apply strong directionality to the arrival direction of the electromagnetic wave and receive more power.

According to another feature of the electromagnetic wave propagation apparatus, the power receiving circuit is provided on the dielectric board. According to another feature of the electromagnetic wave propagation apparatus, the power receiving apparatus includes the electromagnetic wave interface and the power receiving circuit and can be integrally mounted on a general-purpose printed substrate. Therefore, miniaturization and cost reduction effects can be promoted.

According to another feature of the electromagnetic wave propagation apparatus, an end face or an inside of the dielectric board is provided with a shield conductor or a wave absorber that shields an electromagnetic wave. The electromagnetic wave propagation apparatus can prevent an electromagnetic wave from leaking from the edge of the second conductor pattern and contribute to highly effective power transmission.

Embodiments of the present invention will be described in further detail with reference to the accompanying drawings.

First Embodiment

The following describes an electromagnetic wave propagation apparatus according to a first embodiment of the invention with reference to FIGS. 1A through 5B. FIG. 1A is a vertical sectional view showing a configuration of an electromagnetic wave propagation apparatus 100. FIG. 1B shows a plane A-A' of FIG. 1A viewed from a planar propagation medium that contacts with a power receiving apparatus on the plane A-A'.

The electromagnetic wave propagation apparatus 100 propagates an electromagnetic wave as electric power or data (information) between a base station 200 and a terminal 300. According to an example configuration described below, the base station 200 includes a power supply station 7. The terminal 300 includes a unit 22 to be powered. Power is unidirectionally supplied from the power supply station 7 to the unit 22.

The electromagnetic wave propagation apparatus 100 supplies power or information to the unit 22 to be powered from the power supply station 7. The electromagnetic wave propagation apparatus 100 includes a planar propagation medium 5, a power receiving apparatus 23, and an electromagnetic wave input port 6.

The planar propagation medium 5 provides a propagation path for an electromagnetic wave as power or information. As shown in FIG. 2, the planar propagation medium 5 includes a planar conductor 1, a planar dielectric 2, a planar mesh conductor 4, and a planar dielectric spacer 3 that are overlaid on each other in order. Both sides of these components are shaped into substantially parallel planes. The planar mesh conductor 4 extends in a meshed pattern. A mesh pitch can control the amount an electromagnetic wave leaks toward the outside. The electromagnetic wave, referred to as an evanescent wave, leaks toward the outside and exponentially decays with a propagation distance. Typically, a distance of approximately 1 cm decays the amplitude to 1/e, where e is the base of natural logarithm. Generating the electromagnetic wave only near the planar mesh conductor 4 can greatly decrease unnecessary radiation toward the outside. The planar mesh conductor 4 is hardly subject to an interfering wave from the outside because of the reversible principle of a radiation element. The planar dielectric 2 preferably uses a material having a small dielectric constant and a small dielectric loss tangent in consideration of the propagation efficiency. The planar dielectric spacer 3 protects the planar mesh conductor 4. The planar dielectric and the planar dielectric spacer are made of foam polystyrene. The planar conductor and the planar mesh conductor are fabricated through etching or printing.

The electromagnetic wave input port 6 in FIG. 1A provides an interface (first interface) that connects the power supply station 7 and the planar propagation medium 5. The power supply station 7 and the planar propagation medium 5 are arranged parallel to the traveling direction of an electromagnetic wave. The electromagnetic wave input port 6 converts coaxial line mode for the electromagnetic wave output from the power supply station 7 into surface wave mode for the planar propagation medium 5. The power supply station 7 supplies power to the unit 22 via the electromagnetic wave input port 6, the planar propagation medium 5, and the power receiving apparatus 23.

A terminal 300 of the electromagnetic wave propagation apparatus 100 is placed on the planar propagation medium 5. The power receiving apparatus 23 of the terminal 300 includes an electromagnetic wave interface 8 (second interface) and a power receiving circuit 16 provided for the dielectric substrate 11. The electromagnetic wave interface 8 includes a first conductor pattern 9, a second conductor pattern 10, a short via 12, and a through via 13. The short via 12 and the through via 13 electrically connect (short-circuit) the conductor patterns. To form the via, a drill or laser is used to bore a hole through the dielectric substrate 11. The hole is metal-plated inside.

The electromagnetic wave interface 8 enables miniaturization by decreasing a resonant frequency through the use of capacitance between the first conductor pattern 9 and the second conductor pattern 10 that excite two coupling modes. The dielectric substrate 11 includes three parallel layers of conductors, that is, the first conductor pattern 9, the second conductor pattern 10, and a circuit mounting conductor 15. The first conductor pattern 9 contacts with the planar propagation medium 5. The second conductor pattern 10 is used as an intermediate conductor layer. The circuit mounting conductor 15 is provided as the topmost layer opposite the planar propagation medium 5. The electromagnetic wave interface 8 receives power from the planar propagation medium 5. The power is fed to the power receiving circuit 16 on the circuit mounting conductor 15 by way of the through via 13. The power receiving circuit 16 rectifies the power. The power is transformed into a direct current of a specified voltage. The direct current is then supplied to the unit 22.

As shown in FIG. 1B, the first conductor pattern 9 and the second conductor pattern 10 are square shaped with different sizes. The first conductor pattern 9 has first conductor pattern length L. The second conductor pattern 10 has second conductor pattern length gdl (gdl>L). Both patterns are electrically connected together by the short via 12 provided at a corner of the first conductor pattern 9. The through via 13 is provided near the short via 12 within the borders of the first conductor pattern 9 in plan view along a diagonal of the first conductor pattern 9. The first conductor pattern 9 is connected to the power receiving circuit 16, which is in contact with the circuit mounting conductor 15, by way of the through via 13. Reference symbol OS denotes an offset from a corner of the first conductor to the position of the through via 13.

A voltage-driven dipole antenna used in free space has both end faces thereof open. The antenna has a size of ½×λg (λg=effective wavelength) in order to satisfy the resonance condition. By contrast, the structure as shown in FIG. 1B uses a short via 12. One end face of the first conductor pattern 9 is short-circuited. The other end face thereof is open. The resonance is available on the size of L=¼×λg.

Figure 3A:
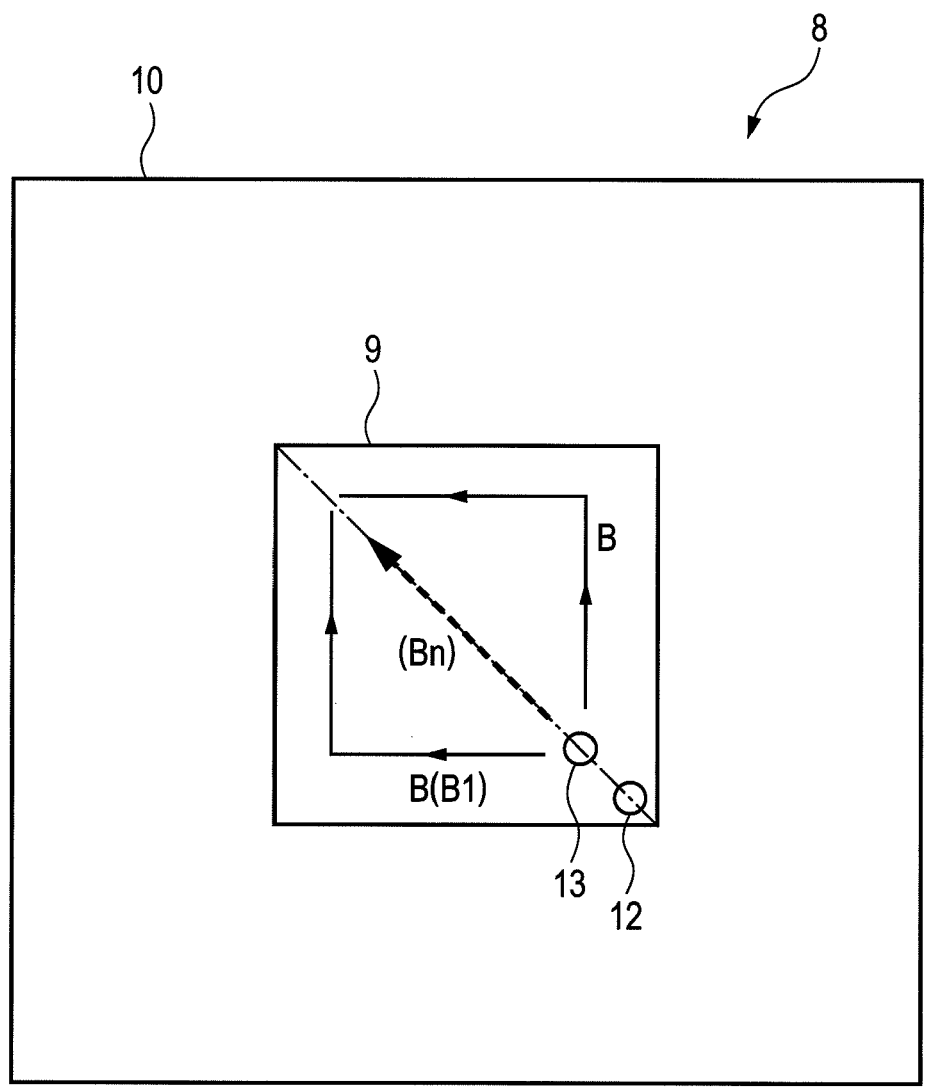
FIG. 3A is an explanatory diagram illustrating resonant mode on a first conductor pattern according to the first embodiment.

FIG. 3A is an explanatory diagram illustrating resonant mode of the first conductor pattern according to the first embodiment. As shown in FIG. 3A, the first square conductor pattern 9 is provided with the through via 13 as a power supply point on the diagonal. The pattern shown in FIG. 3A can flow a current along a short current path B (a path conditioned for a standing wave). The current path B enables resonance at a lower frequency than the current path corresponding to L=¼×λg as the size of one side of the first conductor pattern 9. The second conductor pattern 10 functions as a ground for the first conductor pattern 9. The second conductor pattern 10 needs to be larger than the first conductor pattern 9 for stable operation. A resonance condition determines the size of the second conductor pattern 10 that is also coupled to the planar propagation medium 5. The second conductor pattern 10 can be further miniaturized because the resonant frequency (f1) decreases depending on the capacity in relation to the first conductor pattern 9 or the planar mesh conductor 4. Path B (n) is shorter than rectangularly bent path B (1). Multiple paths B (n) are scattered. Wide-band operation is available for an expanded frequency band from resonant frequency (f1) for path B (1) to resonant frequency (fn) slightly higher than resonant frequency (f1). Multiple operating frequencies may be used. To do this, multiple paths may be provided explicitly. Alternatively, the first conductor pattern 9 and the second conductor pattern 10 resonate at different frequencies. An input impedance for the electromagnetic wave interface 8 monotonically increases from zero to several hundreds ohms as the position of the through via 13 moves along the diagonal from the vicinity of the short via 12. Therefore, the position of the through via 13 can be determined based on consistency of the power receiving circuit or an operating resonant frequency.

Figure 3B:
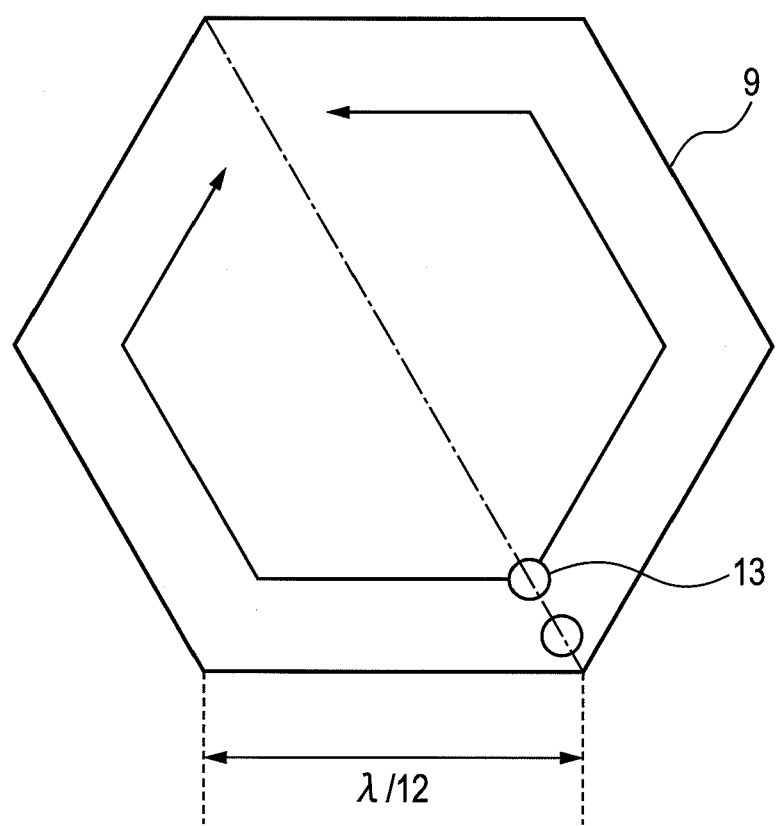
FIG. 3B is an explanatory diagram illustrating resonant mode on a differently shaped first conductor pattern according to the first embodiment.

Shapes of the first conductor pattern and the second conductor pattern are not limited to squares. The present invention is applicable to rectangles and any polygons. The same applies to the other embodiments. Any planar shape preferably contains at least one corner to provide the first conductor pattern 9 with the short via 12. As shown in FIG. 3B, for example, the first conductor pattern 9 is shaped into a regular hexagon. The short via 12 or the through via 13 is provided on the diagonal starting from one corner of the first conductor pattern 9. This can flow a current along the path capable of resonance at a much lower frequency than the current path corresponding to L=λg/12 as the size of one side of the first conductor pattern 9.

If the first conductor pattern and the second conductor pattern are rectangular, selecting their sizes enables operation as a circularly polarized wave. As a result, a less directional electromagnetic wave interface can be provided.

Figure 4:
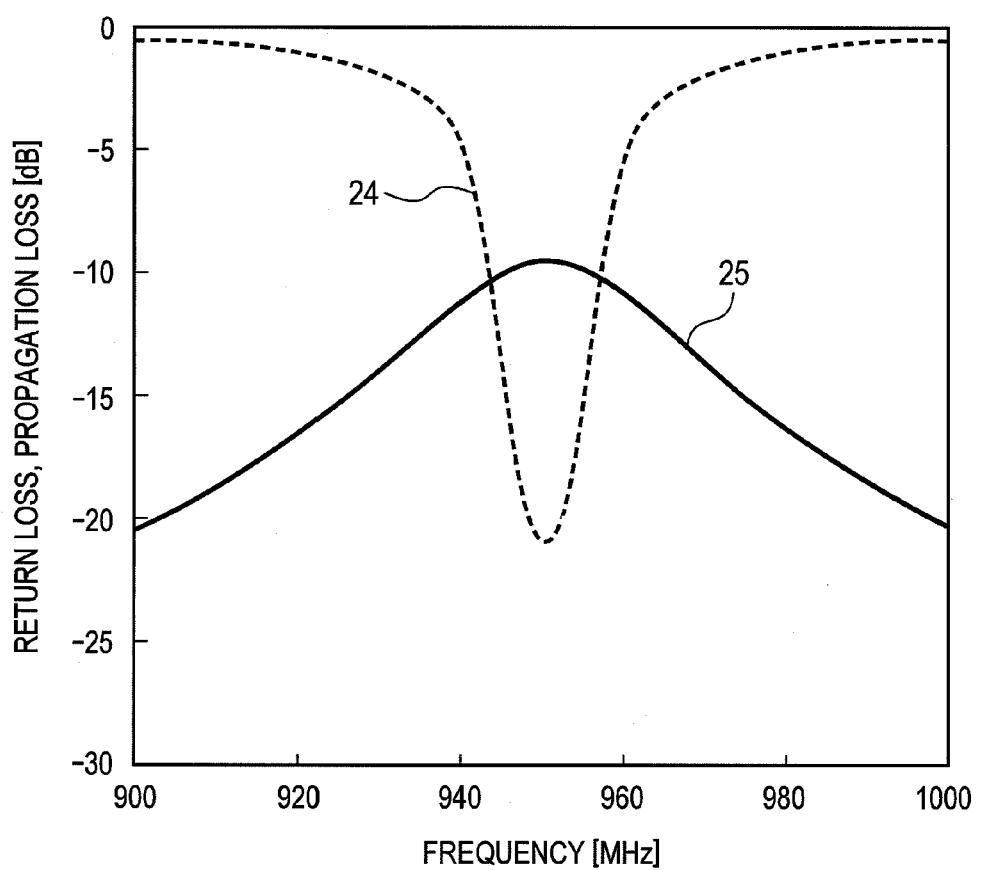
FIG. 4 shows simulation results of an electromagnetic wave interface according to the first embodiment.

FIG. 4 shows simulation results of frequency characteristics for a return loss 24 and a propagation loss 25 at the through via 13 of the electromagnetic wave interface 8. A design frequency is set to 950 MHz, which is commonly used in radio frequency identification (RFID) applications. To calculate the propagation loss, the surface integral value for a pointing vector is divided by the input power on an end face of the finitely sized planar propagation medium. At 950 MHz, the return loss 24 and the propagation loss 25 are found to be −21.0 dB and −9.4 dB, respectively. The simulation uses the following parameters. In FIG. 1B, the second conductor pattern length gdl is set to 50 mm. The first conductor pattern length L is set to 14.7 mm. The positional offset OS for the through via is set to 2.0 mm. The thickness of the dielectric substrate 11 between the first conductor pattern 9 and the second conductor pattern 10 is set to 1.6 mm. The relative dielectric constant is set to 4.7. The first conductor pattern length and the second conductor pattern length correspond to 0.1 λg and 0.34 λg, respectively, in terms of equivalent wavelengths. In FIG. 1A, the conductor mesh line width is set to 1 mm. The conductor mesh pitch p is set to 7 mm. The thickness of the planar dielectric spacer 3 is set to 0.1 mm. The relative dielectric constant is set to 2.1. The thickness of the planar dielectric 2 is set to 3.45 mm. The relative dielectric constant is set to 1.05.

Figure 5A:
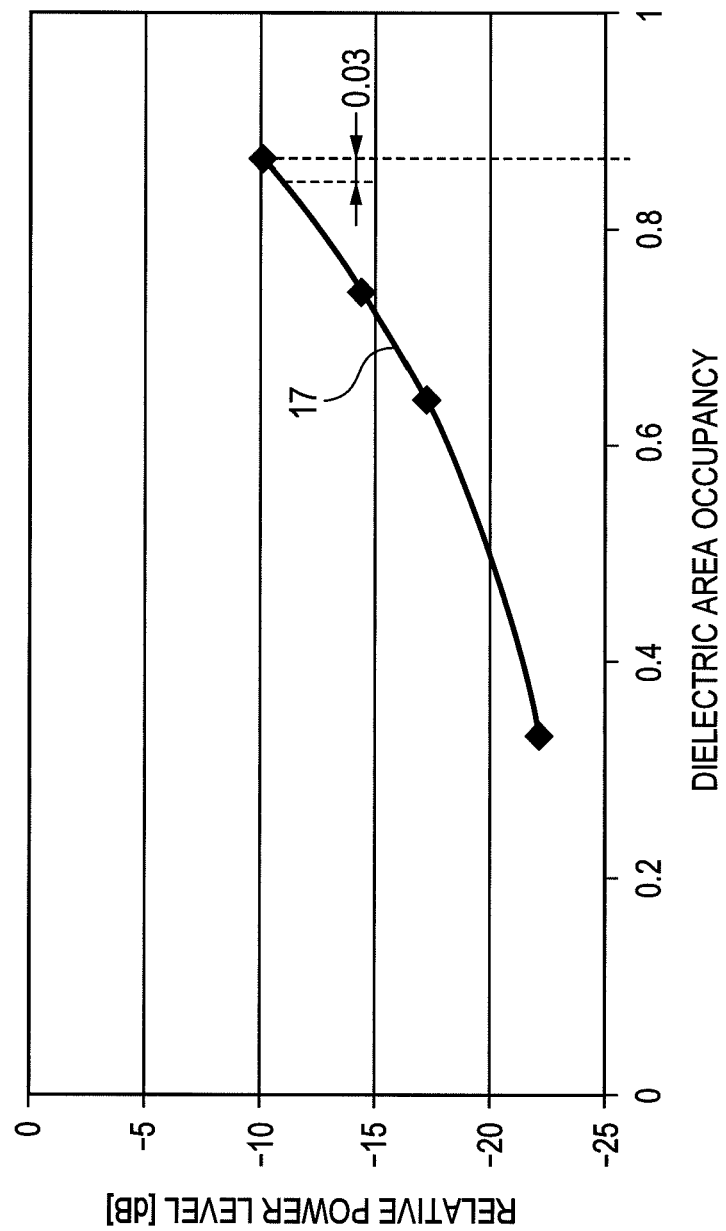
FIG. 5A shows dielectric area occupancy characteristics for the electromagnetic wave interface according to the first embodiment.
Figure 5B:
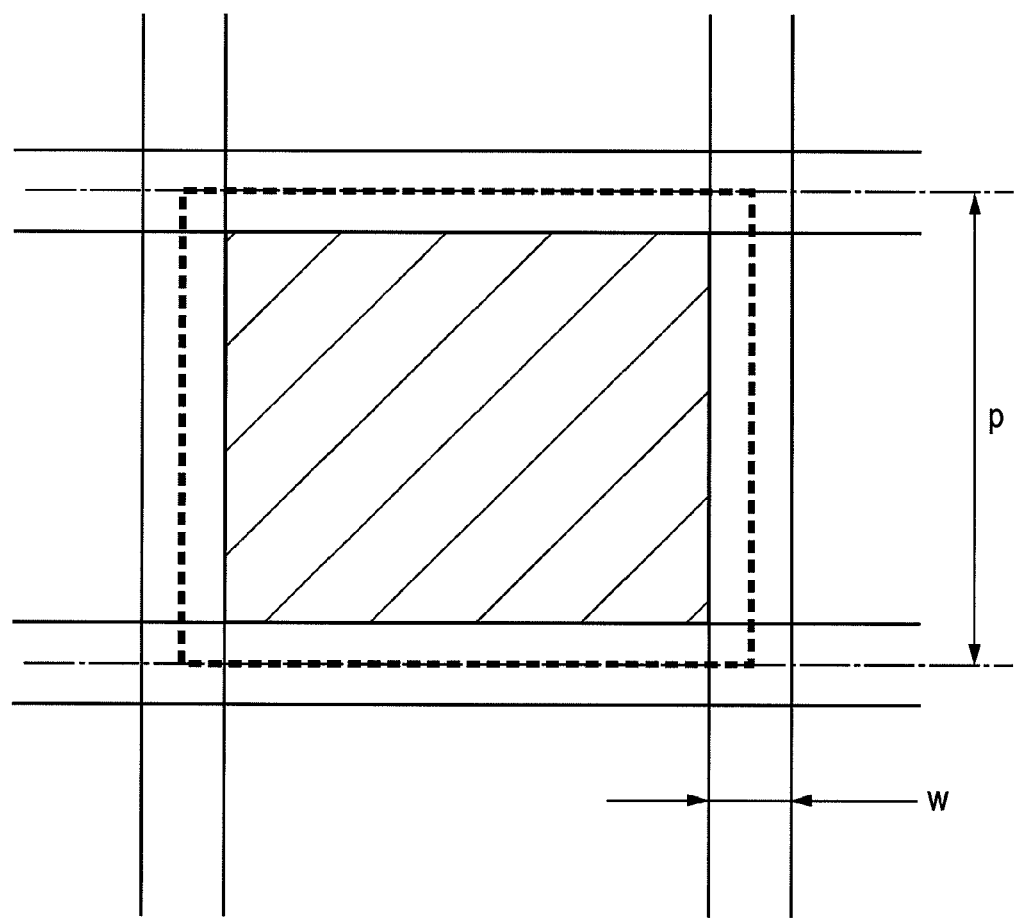
FIG. 5B illustrates the dielectric area in FIG. 5A.

The following describes positional dependence of the power receiving amount on the electromagnetic wave interface. FIG. 5 shows a result of measuring relative variations of the power receiving amount using the electromagnetic wave interface when the conductor mesh line width (w) and the conductor mesh pitch (p) are changed on the planar propagation medium. The horizontal axis represents dielectric area occupancy $((p-w)^2/p^2)$. This signifies the occupancy of an area containing the exposed dielectric and no planar mesh conductor provided in the area of the planar propagation medium covered with the electromagnetic wave interface. The shaded portion in FIG. 5B represents the exposed dielectric area. The vertical axis in FIG. 5A represents relative values of the power receiving amount. Reference numeral 17 denotes the dielectric area occupancy of the power receiving amount. As seen from the graph in FIG. 5A, the power receiving amount tends to increase as a function of the dielectric area occupancy. Accordingly, the positional dependence of the power receiving amount decreases if a positional variation in the electromagnetic wave interface causes a small variation in the dielectric area occupancy. For example, in order to limit the power receiving amount to less than 1 dB, a variation of the dielectric area occupancy is restricted to approximately 0.86+ 0.03.

Equation (1) expresses a variation range containing the maximum variation amount in dielectric area occupancy (D) and second conductor pattern length (gdl') under this condition.

$$\begin{cases} \left\{\frac{n(p-w)}{gdl'}\right\}^2 \le D \le \left\{\frac{n(p-w)+w}{gdl'}\right\}^2, & gdl' = np + w \ \left(w \le \frac{p}{2}\right) \\ \left\{\frac{n(p-w)}{gdl'}\right\}^2 \le D \le \left\{\frac{(n+1)(p-w)}{gdl'}\right\}^2, & gdl' = np + p - w \ \left(w > \frac{p}{2}\right) \end{cases} \quad (1)$$

In this equation, n denotes a whole number. For example, if the parameter conditions used in the simulation of FIG. 4 are used, equation (1) yields a range from 0.71 (Dmin) to 0.74 (Dmax). This allows for a variation of up to 1 dB in the power receiving amount. Stable power can thus be continuously supplied to mobile devices.

The first embodiment has been described with the first conductor pattern 9 and the second conductor pattern 10 both being square shaped. As described above, the present invention is also applicable to rectangles and any polygons. If the patterns are rectangular, selecting their sizes enables operation as a circularly polarized wave. As a result, a less directional electromagnetic wave interface can be provided.

Figure 6A:
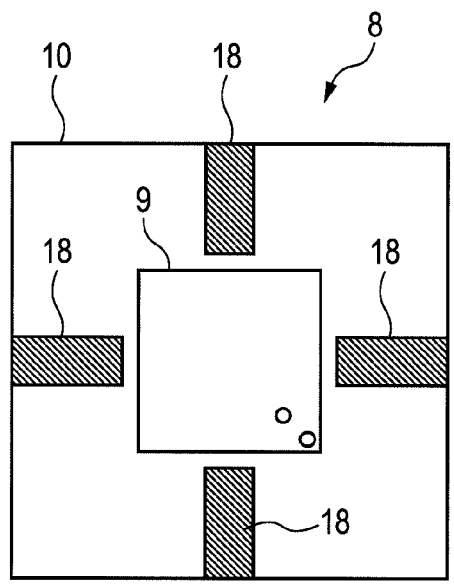
FIGS. 6A-6D show various modifications of the electromagnetic wave interface according to the first embodiment.
Figure 6B:
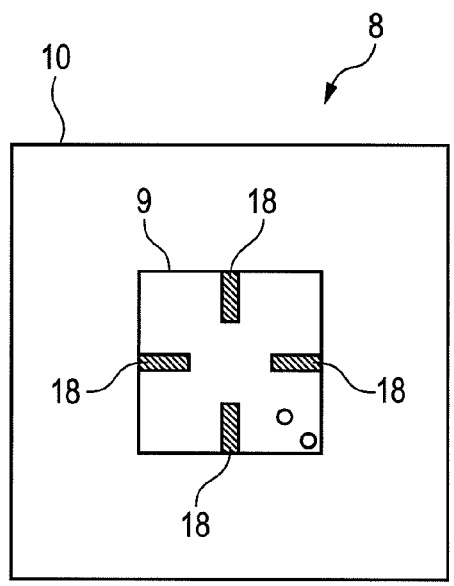
Figure 6C:
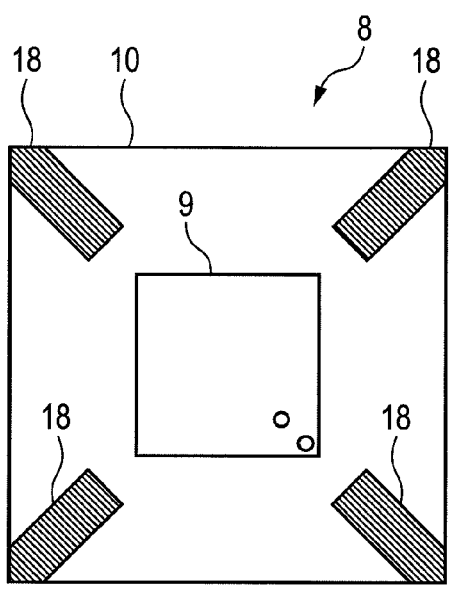
Figure 6D:
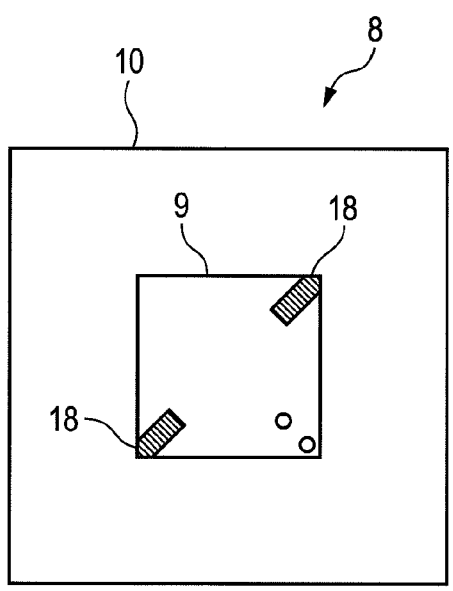

FIGS. 6A through 6D show modifications of the electromagnetic wave interface 8 according to the first embodiment. FIG. 6A shows the electromagnetic wave interface 8 containing multiple rectangular notches 18, each notch 18 extending from a respective side of the second square conductor pattern 10 toward its center. FIG. 6B shows the electromagnetic wave interface 8 containing multiple rectangular notches 18, each notch 18 extending from a respective side of the first square conductor pattern 9 toward its center. FIG. 6C shows the electromagnetic wave interface 8 containing multiple rectangular notches 18, each notch 18 extending from a respective corner of the second square conductor pattern 10 toward its center. FIG. 6D shows the electromagnetic wave interface 8 containing a pair of rectangular notches 18, each notch 18 extending from a respective opposite corner of the first square conductor pattern 9 toward its center. In this case, the two corners are on a diagonal that does not contain the through via 13 in the first conductor pattern 9. These modifications divert the current path on the first square conductor pattern 9 or the second square conductor pattern 10 and are therefore effective for miniaturization. While the modifications use two or four notches, one or more notches are also effective. Other notch positions and/or notch shapes are also possible. Other polygonal patterns can also be miniaturized by using one or more notches to bypass the current path.

Figure 7:
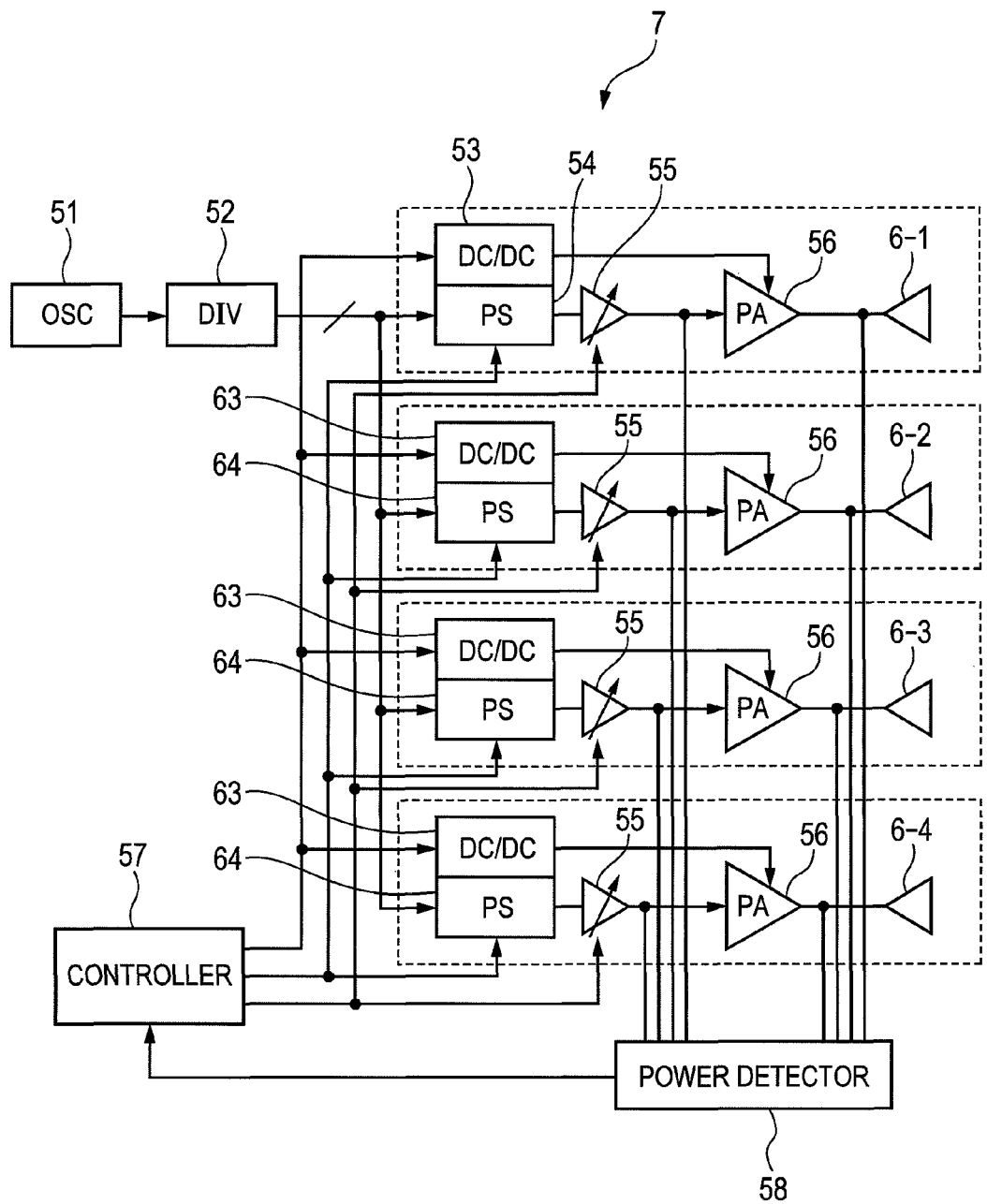
FIG. 7 shows a configuration of a power supply station including four electromagnetic wave input ports according to the first embodiment.

FIG. 7 exemplifies a configuration of the power supply station 7 including four electromagnetic wave input ports 6 (6-1, 6-2, 6-3, and 6-4). The power supply station 7 includes an oscillator 51, a divider 52, a power supply voltage converter 53, a phase shifter 54, a variable gain amplifier 55, a power amplifier 56, a controller 57, and a power detector 58. The power supply voltage converter 53, the phase shifter 54, the variable gain amplifier 55, and the power amplifier 56 are provided for each of the four electromagnetic wave input ports 6. The oscillator 51 generates a signal at a frequency equivalent to the usable frequency for the electromagnetic wave propagation apparatus 100. The divider 52 distributes a usable-frequency signal to the four phase shifters 54. The phase shifter 54 adjusts the phase of the input signal and supplies an output to the variable gain amplifier 55. The power supply voltage converter 53 supplies the power to the power amplifier 56. The variable gain amplifier 55 changes the gain and adjusts the output power to output it. The power amplifier 56 outputs the power to the electromagnetic wave input port 6. The controller 57 controls the power supply voltage converter 53, the phase shifter 54, and the variable gain amplifier 55 of each electromagnetic wave input port based on the output power that is output from each variable gain amplifier 55 and each power amplifier 56 and detected by the power detector 58.

The power supply station 7 preferably supplies power at a high efficiency of electric power transmission. The efficiency signifies a ratio between consumed power and transmission power for the power supply station 7. Reception power for the power receiving apparatus 23 varies with its positions on the planar propagation medium 5. It is preferable to keep the reception power constant by adjusting and compensating the transmission power for the power supply station 7. Alternatively, a large amount of power is preferably transmitted when the efficiency of electric power transmission is high. The transmission power is preferably varied in accordance with the consumed power or the operation state of the unit 22 connected to the power receiving apparatus 23. That is, the power supply station 7 preferably provides a high efficiency of electric power transmission in terms of a wide range of transmission power such as 10 dB.

For this purpose, each power supply voltage converter 53 adjusts the power supply voltage for each power amplifier 56 and each variable gain amplifier 55 adjusts the input power for each power amplifier 56 in accordance with the targeted transmission power based on states of the unit 22. That is, the power supply voltage and the input power for the power amplifier 56 are increased as the targeted transmission power increases. As a result, the power amplifier 56 can be used in a saturated state over a wide range of transmission power. The efficiency of electric power transmission can be kept high.

The power detector 58 detects the power input to or output from each power amplifier 56 to determine whether the power amplifier 56 outputs the targeted transmission power in a saturated state. The power detector 58 detects the power output from each power amplifier 56 to determine whether the targeted transmission power is output. The power detector 58 detects the power input to each power amplifier 56 to detect the power gain for each power amplifier 56 and determine whether each power amplifier 56 operates in a saturated state.

The power amplifier 56 preferably uses a constant power gain regardless of the transmission power if the consumed power for the power amplifier 56 accounts for a large percentage of the entire consumed power for the power supply station 7. By contrast, the power gain for the power amplifier 56 is preferably increased as the transmission power decreases if the consumed power for the components other than the power amplifier 56 accounts for a large percentage thereof.

The controller 57 controls the phase regulation amount for each phase shifter 54 so that electromagnetic waves output from the electromagnetic wave input ports 6 are mutually increased at the position for the power receiving apparatus 23 on the planar propagation medium 5. As a result, the reception power for the power receiving apparatus 23 is preferably increased. Alternatively, the controller 57 preferably controls each phase regulation amount so that electromagnetic waves output from the electromagnetic wave input ports 6 are mutually canceled at a position other than the power receiving apparatus 23 on the planar propagation medium 5 or at a position where power transmission needs to be avoided.

FIG. 7 shows a configuration example of the power supply station 7 using four electromagnetic wave input ports 6. One or more electromagnetic wave input ports 6 may be used. The electromagnetic wave input ports 6 may share all or some of the power supply voltage converter 53, the phase shifter 54, the variable gain amplifier 55, and the power amplifier 56. There may be provided multiple oscillators 51 and dividers 52. A frequency converter may replace the phase shifter. As a result, all or part of the electromagnetic wave input ports 6 may output electromagnetic waves with different frequencies. The electromagnetic waves with different frequencies are output from the electromagnetic wave input ports 6 and are mutually increased or canceled at a specified position on the planar propagation medium 5.

Figure 8A:
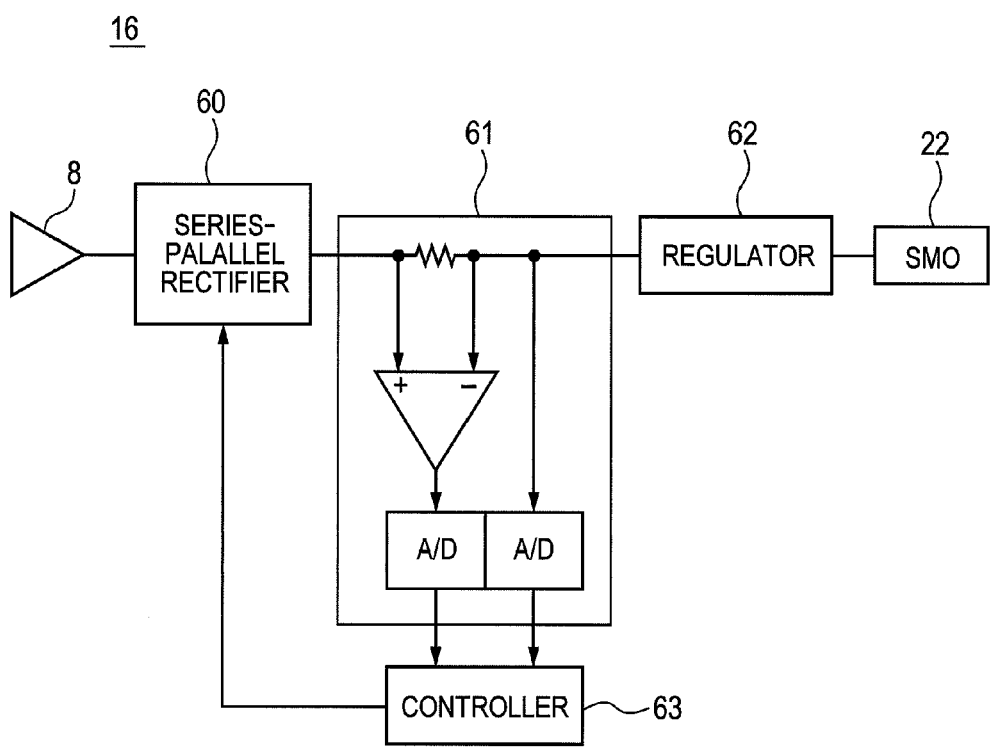
FIG. 8A exemplifies a configuration of a power receiving circuit according to the first embodiment.

The power receiving circuit 16 will be described below. FIG. 8A exemplifies a configuration of the power receiving circuit 16. The power receiving circuit 16 includes a series-parallel rectifier 60, a voltage/current detector 61, a regulator 62, and a controller 63. When the electromagnetic wave interface 8 receives alternating-current power, the series-parallel rectifier 60 rectifies the received power to direct-current power. The voltage/current detector 61 detects a current flowing from the series-parallel rectifier 60 to the regulator 62 and an output voltage from the series-parallel rectifier 60. The regulator 62 converts an output voltage from the series-parallel rectifier 60 into a voltage appropriate for the unit 22 and outputs the converted voltage. The controller 63 controls the number of series-parallel rectifiers in accordance with the voltage and current values detected by the voltage/current detector 61. The controller 63 can also find the power using the voltage and current values detected by the voltage/current detector 61.

The voltage/current detector 61 uses a tiny resistor to convert a current flowing from the series-parallel rectifier 60 to the regulator 62 into a voltage and detects it. The voltage/current detector 61 may use an analog-digital converter to convert the detected voltage as well as the voltage input to the regulator 62 into digital values.

The reception power supplied by the electromagnetic wave interface 8 varies with the transmission power from the power supply station 7 or the position of the power receiving apparatus 23 on the planar propagation medium 5. The required voltage or power varies with the consumed power or the operation state of the unit 22. In consideration of these, the series-parallel rectifier 60 preferably maintains a high efficiency of electric power reception over a wide range of reception power such as approximately 10 dB.

Figure 8B:
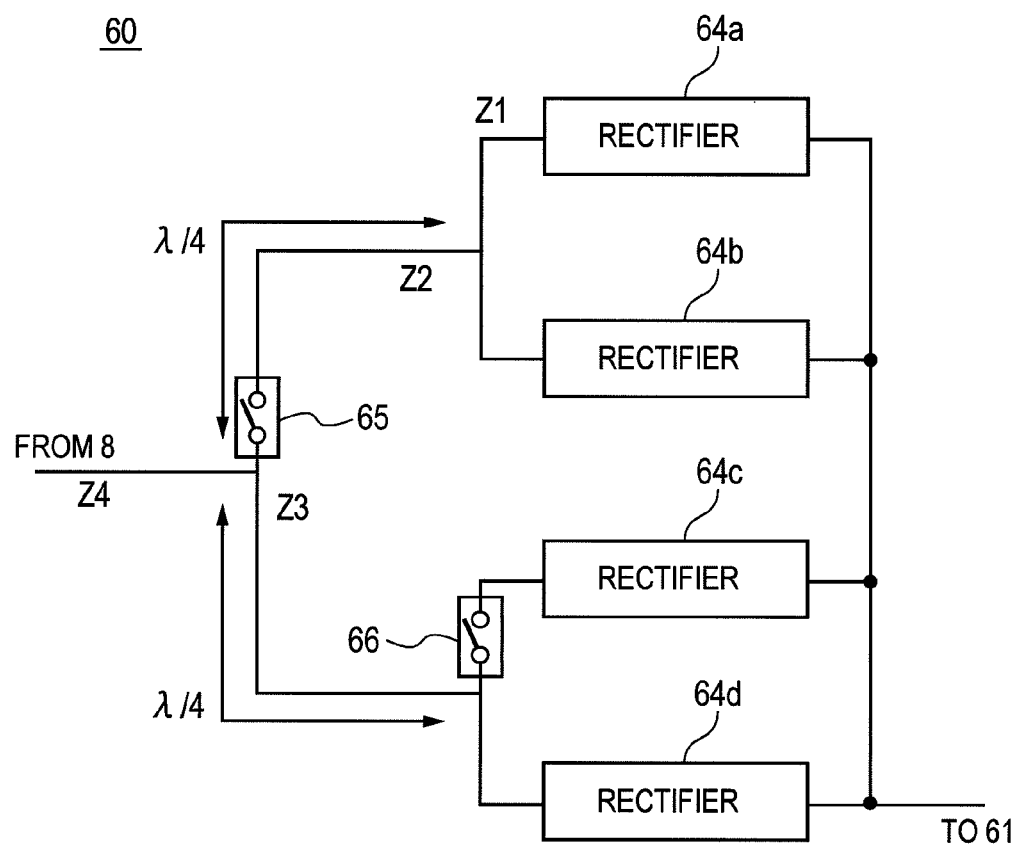
FIG. 8B exemplifies a configuration of a series-parallel rectifier according to the first embodiment.
Figure 8C:
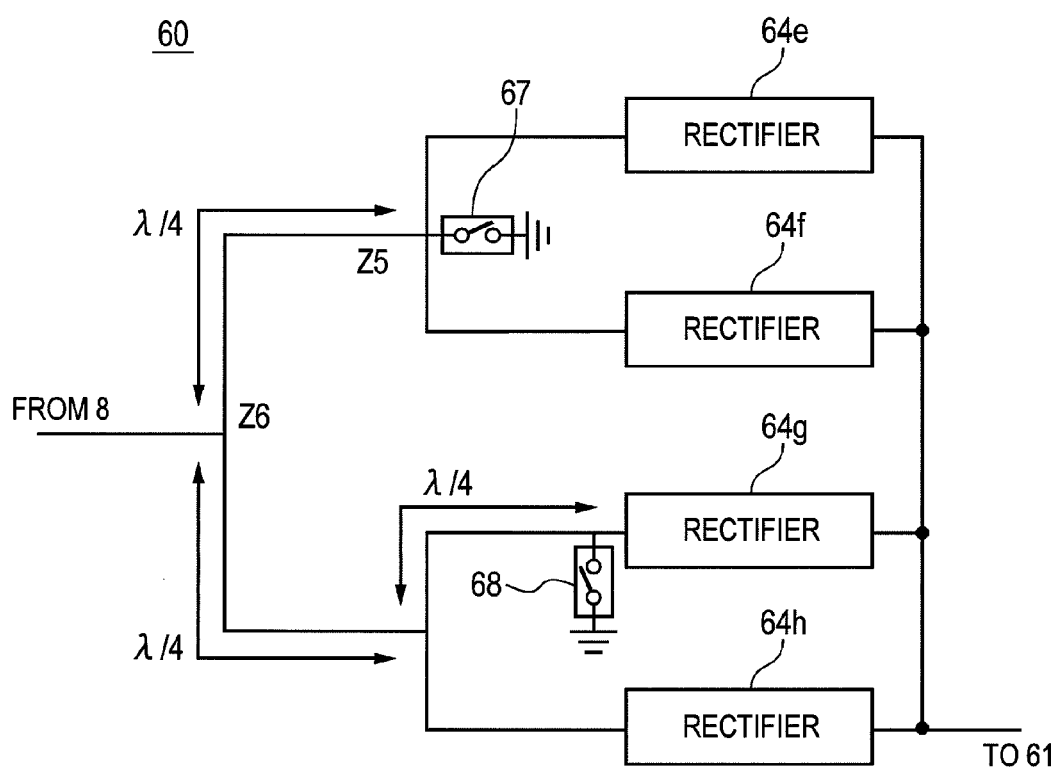
FIG. 8C exemplifies another configuration of a series-parallel rectifier according to the first embodiment.

For this purpose, the controller 63 controls the number of series or parallel rectifiers 64 operating in the series-parallel rectifier 60 for a specific condition. FIGS. 8B and 8C show configurations of the series-parallel rectifier 60. FIG. 8B is an example of controlling the number of series or parallel rectifiers 64 using switches 65 and 66. FIG. 8C is an example of controlling the number of series or parallel rectifiers 64 using switches 67 and 68.

In FIG. 8B Z1 is an input impedance of the rectifier 64. A transmission line of characteristic impedance Z1 connects input positions of two rectifiers 64a and 64b. When observed from the connection point, input impedance Z2 equals half Z1. Let us observe the position of input impedance Z2 in consideration of the characteristic impedance Z1 and a transmission line as long as a quarter of wavelength $\lambda$ of the frequency to be used. Then, the input impedance Z2 is equivalent to Z3, that is, four times of Z2 and double Z1. Accordingly, connecting two positions of input impedance Z3 causes input impedance Z4 observed from the connection point to be half Z3, that is, Z1. Let us suppose that the switches 65 and 66 are opened to disconnect the rectifiers 64a, 64b, and 64c. Then, the input impedance Z1 of the rectifier 64d equals the input impedance Z4. The series-parallel rectifier 60 is set to the input impedance Z1. The controller 63 controls the switches 65 and 66.

This configuration can change the number of series or parallel rectifiers 64 while maintaining the input impedance of the series-parallel rectifier 60 to be constant. A wide range of reception power can be efficiently received.

Similar to FIG. 8B, the configuration in FIG. 8C can maintain the input impedance to be constant even if the number of series or parallel rectifiers 64 is changed. The switches 67 and 68 have the function of short-circuiting the transmission line for the characteristic impedance Z1 to ground. Closing the switch 67 decreases impedance Z5 at the position of the switch 67 and ideally zeros it. However, closing the switch 67 increases impedance Z6 and ideally allows it to reach an infinite value at the position in consideration of a transmission line as long as a quarter of wavelength $\lambda$ of the frequency to be used. As with the case of opening switch 65 in FIG. 8B, closing the switch 67 disconnects rectifiers 64e and 64f at a frequency to be used. Similarly, closing a switch 68 disconnects rectifier 64g. The controller 63 controls the switches 67 and 68.

This configuration can change the number of series or parallel rectifiers 64 while maintaining the input impedance for the series-parallel rectifier 60 to be constant without adding an element in series to the reception power line. A wide range of reception power can be efficiently received.

The examples in FIGS. 8A through 8C show four series or parallel rectifiers 64 but the invention is not limited thereto. For example, three or more rectifiers 64 may be connected to use nine or more rectifiers 64 in total. The invention is not limited to two connection positions but may use four connection positions or more.

Other electrical devices can be used in place of switches 65, 66, 67, and/or 68 so long as they provide an electrical function equivalent to that of the replaced switch at the particular frequency employed. For example, a variable capacitor may be used. The capacitance value can be increased when the switches 65, 66, 67, and 68 are closed. The capacitance value can be decreased when the same switches are opened. In addition, it may be preferable to use a variable resistor or other elements capable of varying electrical characteristics.

According to the first embodiment, the short via 12 short-circuits the first conductor pattern 9 and the second conductor pattern 10. The short via 12 is not limited to a circular shape and may have different configurations so long as it electrically connects both patterns together. The dielectric substrate 11 containing three layers of conductors may use different materials for substrates bonded to each other. The electromagnetic wave interface 8 and the power receiving circuit 16 may be physically separated.

The first embodiment has described the electromagnetic wave interface 8 used for power reception. The electromagnetic wave interface 8 may be used as the electromagnetic wave input port 6 for power transmission in order to promote miniaturization.

The first embodiment has described the electromagnetic wave propagation apparatus 100 as a power supply apparatus. The power supply station 7 and the power receiving circuit 16 may be replaced by a communication base station and a receiver, respectively. As a result, the electromagnetic wave propagation apparatus 100 can transmit an electromagnetic wave as a communication signal or a control signal between units instead of for use as electric power. Obviously, configuration combinations can enable both signals to be transmitted simultaneously or under time sharing control.

The base station 200 and the terminal 300 according to the invention may each include a function of transmitting and receiving electromagnetic waves via the electromagnetic wave propagation apparatus 100 in order to bidirectionally exchange information. In this case, each terminal 300 includes a power supply station as well as the power receiving circuit. The base station 200 includes a power receiving circuit as well as the power supply station. For example, there may be a system that transmits power or control signals to the terminals 300 from the base station 200 and transmits response information or measurement data to the base station 200 from the terminals 300.

For example, the unit 22 of the terminal 300 may be equivalent to a mobile device such as a robot that is used for medical care, nursing care, or security and that moves on the planar propagation medium 5. The electromagnetic wave propagation apparatus 100 enables supply of wireless, contactless, and highly reliable continuous power and communication from the base station to the mobile device and allows the mobile device to perform specified tasks. The mobile device can operate for a long time without the need to mount a heavy battery.

As described above, the electromagnetic wave propagation apparatus 100 according to the first embodiment decreases a resonant frequency using the capacitance between the first conductor pattern 9 and the second conductor pattern 10 for exciting two coupling modes and the capacitance between the planar mesh conductor 4 and both conductor patterns. The short via 12 short-circuits both conductor patterns. The through via 13 is provided as a power supply point on the diagonal of the first conductor pattern 9. As a result, the electromagnetic wave interface 8 can be miniaturized and is capable of wide-band operation.

The electromagnetic wave propagation apparatus according to the first embodiment provides the short via at the corner of the first conductor pattern. The short via short-circuits one end face of the first conductor pattern and decreases a resonant frequency for the electromagnetic wave interface. As a result, the electromagnetic wave interface can be miniaturized. The electromagnetic wave propagation apparatus according to the first embodiment provides the through via along the diagonal including the corner of the first square conductor pattern provided with the short via. The through via can elongate the current path on the first conductor pattern and decreases a resonant frequency for the electromagnetic wave interface. As a result, the electromagnetic wave interface can be miniaturized.

According to the first embodiment, the power receiving apparatus 23 includes the electromagnetic wave interface 8 and the power receiving circuit 16 and can be integrally mounted on a general-purpose printed substrate. Therefore, miniaturization and cost reduction can be achieved. The electromagnetic wave propagation apparatus according to the first embodiment provides the dielectric board with conductor patterns, that is, the first conductor pattern and the second conductor pattern, that are both planar. At least one through via is provided as a means to connect the first conductor pattern and the power receiving circuit. At least one short via is provided as a means to electrically connect the first conductor pattern and the power receiving circuit at a corner of the first conductor pattern. The electromagnetic wave interface contains a layer of planar members. For example, the electromagnetic wave interface can be manufactured through a general-purpose substrate forming process using a glass-epoxy printed substrate. As a result, the wireless power supply system can be provided inexpensively.

The outline of the second conductor pattern covers the outline of the first conductor pattern when the electromagnetic wave propagation apparatus according to the first embodiment is viewed in a direction perpendicular to the dielectric. The electromagnetic wave interface can be provided with a large ground area to ensure stable operation.

The electromagnetic wave interface 8 used for the electromagnetic wave propagation apparatus 100 according to the first embodiment can adjust the power receiving amount in accordance with the dielectric area occupancy. The positional dependence of the power receiving amount can be decreased if the planar mesh conductor 4 is shaped so as to decrease a variation in the dielectric area occupancy.

The electromagnetic wave propagation apparatus according to the first embodiment can miniaturize the electromagnetic wave interface so as to be capable of wide-band operation. The power receiving amount can be adjusted in accordance with the dielectric area occupancy. The positional dependence of the power receiving amount can be decreased if the planar mesh conductor 4 is shaped so as to decrease a variation in the dielectric area occupancy.

Second Embodiment

Figure 9B:
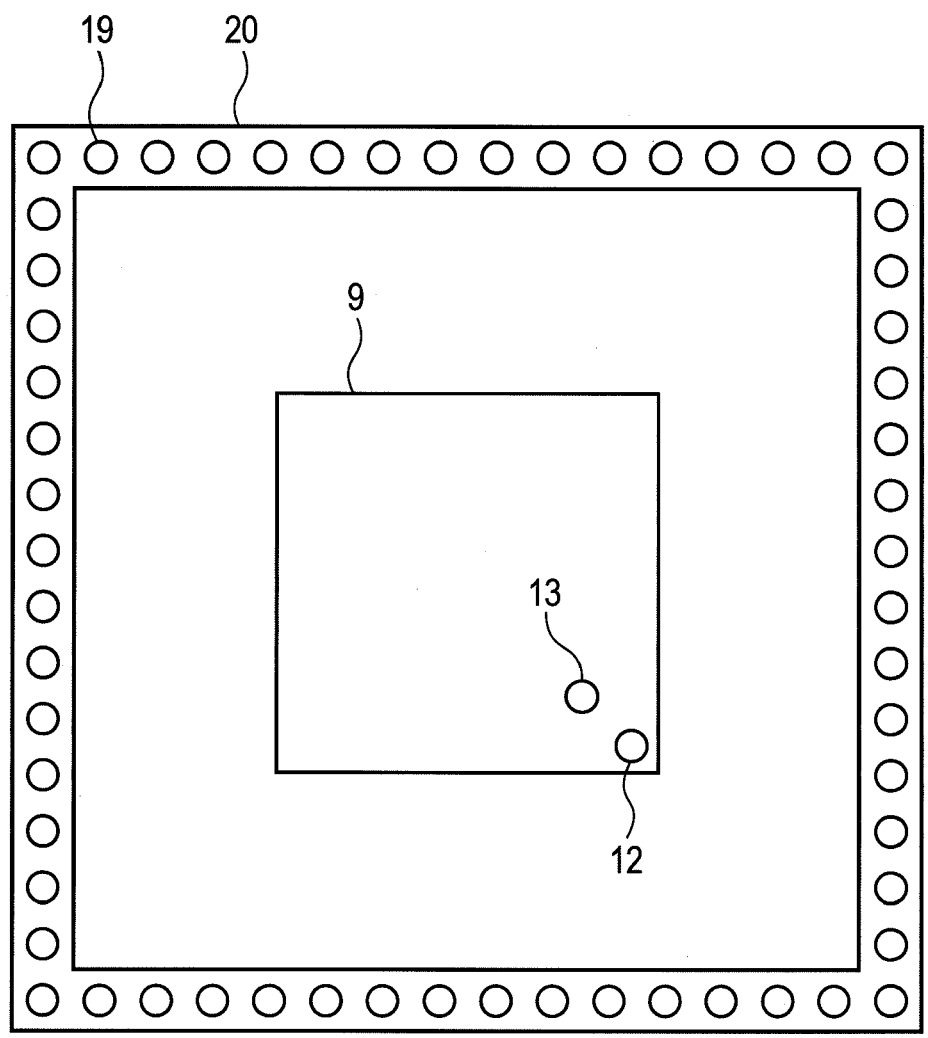
FIG. 9B shows a plane A-A' of FIG. 9A viewed from a planar propagation medium that contacts with a power receiving apparatus on the plane A-A'.

The second embodiment of the invention will be described below. FIG. 9A is a vertical sectional view showing a configuration of the electromagnetic wave propagation apparatus 100 according to the second embodiment of the invention. FIG. 9B shows a plane A-A' of FIG. 9A viewed from the planar propagation medium 5 that contacts with the power receiving apparatus 23 on the plane A-A'.

The electromagnetic wave propagation apparatus 100 propagates an electromagnetic wave as electric power or information between the base station 200 and the terminal 300. Similarly to the first embodiment, the following describes an example configuration in which power is unidirectionally supplied from the power supply station 7 to the unit 22.

The electromagnetic wave propagation apparatus 100 allows the power supply station 7 to supply power to the unit 22 to be fed. The electromagnetic wave propagation apparatus 100 includes the planar propagation medium 5, the power receiving apparatus 23, and the electromagnetic wave input port 6. The power receiving apparatus 23 includes the electromagnetic wave interface 8 and the power receiving circuit 16 provided on the dielectric substrate 11. The electromagnetic wave interface 8 includes the first square and planar conductor pattern 9, the second square and planar conductor pattern 10, the short via 12, the through via 13, the shield via group 19, and the shield conductor 20. To form the short via 12, the through via 13, and the shield via group 19, a drill or laser is used to bore a hole through the dielectric substrate 11. The hole is metal-plated inside. The power supply station 7 and the power receiving circuit 16 have the same configurations and functions as the first embodiment.

The electromagnetic wave interface 8 enables miniaturization by decreasing a resonant frequency through the use of capacitance between the first conductor pattern 9 and the second conductor pattern 10 that excites two coupling modes. The dielectric substrate 11 includes three layers of conductors. The first conductor pattern 9 forms a conductor layer in contact with the planar propagation medium 5. The second conductor pattern 10 forms an intermediate conductor layer. The circuit mounting conductor 15 forms a layer opposite the planar propagation medium 5. The electromagnetic wave interface 8 receives power from the planar propagation medium 5. The power is fed to the power receiving circuit 16 on the circuit mounting conductor 15 through the through via 13. The power receiving circuit 16 rectifies the power. The power is transformed into a specified voltage. The power is then supplied to the unit 22. The shield via group 19 and the shield conductor 20 are connected to the second conductor pattern 10 and prevent an electromagnetic wave from leaking from the edge of the second conductor pattern 10. The shield via group 19 and the shield conductor 20 contribute to highly effective power transmission.

As shown in FIG. 9B, the short via 12 is provided at a corner of the first conductor pattern 9 and electrically connects the first conductor pattern 9 and the second conductor pattern 10. The through via 13 is provided near the short via 12 along a diagonal of the first square conductor pattern 9. The through via 13 connects the first conductor pattern 9 with the power receiving circuit 16. This structure uses the short via 12 to short-circuit one of the end faces. The through via 13 is provided as a power supply point along the diagonal of the first conductor pattern 9. The structure enables resonance at a low frequency. The second conductor pattern 10 functions as the ground for the first conductor pattern 9. Therefore, the second conductor pattern 10 needs to be larger than the first conductor pattern 9 in size for stable operation. The second conductor pattern 10 and the shield conductor 20 are also coupled with the planar propagation medium 5. Their dimensions also depend on resonance conditions. The capacitance between the first conductor pattern 9 and the planar mesh conductor 4 can decrease a resonant frequency. Further miniaturization is possible. In addition, the shield via group 19 and the shield conductor 20 equivalently increase the area of the second conductor pattern 10 and promote the miniaturization. A pitch of ¼ λg or smaller is preferably provided between adjacent shield vias in the shield via group 19. An input impedance for the electromagnetic wave interface 8 monotonically increases from zero to several hundreds ohms as the position of the through via 13 moves along the diagonal from the vicinity of the short via 12. Therefore, the position of the through via 13 needs to be determined in consideration of consistency with the power receiving circuit or an operating resonant frequency.

The second embodiment has described the configuration using the shield via group 19 and the shield conductor 20 as a means to prevent an electromagnetic wave from leaking from the electromagnetic wave interface. As an alternative, an end face of the dielectric substrate 11 may be provided with a metal foil or a wave absorber operating at a usable frequency band.

The second embodiment has described the electromagnetic wave interface 8 used for power reception. The electromagnetic wave interface 8 may be used as the electromagnetic wave input port 6 for power transmission in order to promote miniaturization.

As described above, the electromagnetic wave propagation apparatus 100 according to the second embodiment decreases a resonant frequency using the capacitance between the first conductor pattern 9 and the second conductor pattern 10 for exciting two coupling modes and the capacitance between the planar mesh conductor 4 and both conductor patterns. The short via 12 electrically connects both conductor patterns. The through via 13 is provided as a power supply point on the diagonal of the first conductor pattern 9. The shield via group 19 and the shield conductor 20 are connected to the second conductor pattern 10. As a result, the electromagnetic wave interface 8 can be miniaturized and is capable of wide-band operation.

The electromagnetic wave interface 8 used for the electromagnetic wave propagation apparatus 100 according to the second embodiment is provided with the shield via group 19 and the shield conductor 20. The shield via group 19 and the shield conductor 20 can prevent an electromagnetic wave from leaking from the edge of the second conductor pattern 10 and contributes to highly effective power transmission.

The electromagnetic wave interface 8 used for the electromagnetic wave propagation apparatus 100 according to the second embodiment can adjust the power receiving amount in accordance with the dielectric area occupancy. The positional dependence of the power receiving amount can be decreased if the planar mesh conductor 4 is shaped so as to decrease a variation in the dielectric area occupancy.

According to the second embodiment, the power receiving apparatus 23 includes the electromagnetic wave interface 8 and the power receiving circuit 16 and can be integrally mounted on a general-purpose printed substrate. Therefore, miniaturization and cost reduction can be achieved.

The second embodiment has described the electromagnetic wave propagation apparatus 100 as a power supply apparatus. The power supply station 7 and the power receiving circuit 16 may be replaced by a communication base station and a receiver, respectively. As a result, the electromagnetic wave propagation apparatus 100 can transmit an electromagnetic wave as a communication signal or a control signal between units instead of for electrical power. Other configurations and combinations that enable both signals to be transmitted simultaneously or under time sharing control are also possible.

The base station 200 and the terminal 300 may each include a function of transmitting and receiving electromagnetic waves in order to bidirectionally exchange information. In this case, each terminal 300 includes a power supply station as well as the power receiving circuit. The base station 200 includes a power receiving circuit as well as the power supply station. For example, there may be a system that transmits power or control signals to the terminals 300 from the base station 200 and transmits response information or measurement data to the base station 200 from the terminals 300.

Third Embodiment

The third embodiment of the invention will be described below.

Figure 10A:
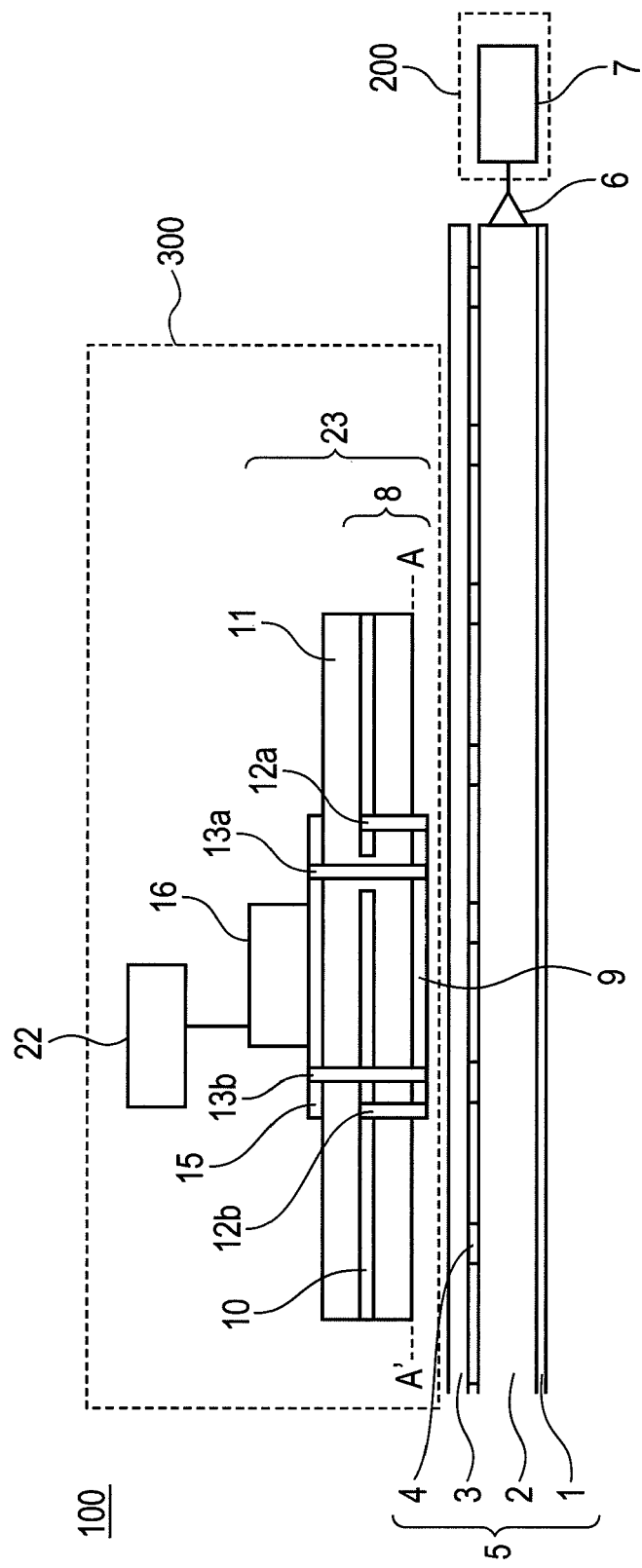
FIG. 10A is a vertical sectional view showing a configuration of an electromagnetic wave propagation apparatus according to a third embodiment of the invention.

FIG. 10A is a vertical sectional view showing a configuration of the electromagnetic wave propagation apparatus 100 according to the third embodiment of the invention. FIG. 10B shows a plane A-A' of FIG. 10A viewed from the planar propagation medium 5 that contacts with the power receiving apparatus 23 on the plane A-A'. The electromagnetic wave propagation apparatus 100 allows the power supply station 7 to supply power to the unit 22 to be fed. The electromagnetic wave propagation apparatus 100 includes the planar propagation medium 5, the power receiving apparatus 23, and the electromagnetic wave input port 6. The power receiving apparatus 23 includes the electromagnetic wave interface 8 and the power receiving circuit 16 provided on the dielectric substrate 11. The electromagnetic wave interface 8 includes the first conductor pattern 9, the second conductor pattern 10, short vias 12a and 12b, and through vias 13a and 13b. To form the short vias 12a and 12b and the through vias 13a and 13b, a drill or laser is used to bore a hole through the dielectric substrate 11. The hole is metal-plated inside. The power supply station 7 and the power receiving circuit 16 have the same configurations and functions as the first embodiment.

The electromagnetic wave interface 8 enables miniaturization by decreasing a resonant frequency through the use of capacitance between the first conductor pattern 9 and the second conductor pattern 10 that excite two coupling modes. The dielectric substrate 11 includes three layers of conductors. The first conductor pattern 9 forms a conductor layer in contact with the planar propagation medium 5. The second conductor pattern 10 forms an intermediate conductor layer. The circuit mounting conductor 15 forms a layer opposite the planar propagation medium 5. The electromagnetic wave interface 8 receives power from the planar propagation medium 5. The power is fed to the power receiving circuit 16 on the circuit mounting conductor 15 through the through vias 13a and 13b. The power receiving circuit 16 rectifies the power. The power is transformed into a specified voltage. The power is then supplied to the unit 22.

As shown in FIG. 10B, the short vias 12a and 12b are provided at different corners of the first conductor pattern 9 and electrically connect the first conductor pattern 9 and the second conductor pattern 10, which are both square. The through vias 13a and 13b connect the first conductor pattern 9 and the second conductor pattern 10 with the power receiving circuit 16. The through via 13a is provided near the short via 12a at a first corner of the square bottom along the diagonal of the first conductor pattern 9. The through via 13b is provided near the short via 12b at a second corner of the square bottom along the diagonal thereof. This structure uses the short vias 12a and 12b to short-circuit one of end faces.

The through vias 13a and 13b are provided as power supply points along respective diagonals of the first conductor pattern 9. The structure enables resonance at a low frequency. The second conductor pattern 10 functions as the ground for the first conductor pattern 9. Therefore, the second conductor pattern 10 needs to be larger than the first conductor pattern 9 in size for stable operation. The second conductor pattern 10 is also coupled with the planar propagation medium 5. The dimension also depends on resonance conditions. The capacitance between the first conductor pattern 9 and the planar mesh conductor 4 can decrease a resonant frequency. Further miniaturization is possible. An input impedance for the electromagnetic wave interface 8 increases from zero to several hundreds ohms as the position of the through via 13a, 13b moves along the respective diagonal from the vicinity of the respective short via 12. Therefore, the position of the through via 13a, 13b needs to be determined in consideration of consistency with the power receiving circuit or an operating resonant frequency.

The electromagnetic wave interface is preferably non-directional. Multiple reflections occur within the planar propagation medium 5 if it has a short-circuited or opened reflection end face. The arrival direction of an electromagnetic wave may vary with position. This problem can be addressed by providing a wave absorber, which operates at the usable frequency, for the end face of the planar propagation medium 5. However, components absorbed in the wave absorber result in a loss. It is important to evenly receive electromagnetic waves in all arrival directions inside the planar propagation medium 5 from the viewpoint of accessibility to the electromagnetic wave interface 8. The through vias 13a and 13b produce the power that contains electromagnetic field components excited by mutually orthogonal resonant modes 26a and 26b. The resonant modes 26a and 26b cause a 90-degree phase difference. That is, the resonant modes 26a and 26b operate equivalently to an ordinary circular polarized receiving antenna and evenly receive electromagnetic waves in all arrival directions. The power produced from the through vias 13a and 13b is given a 90-degree phase difference and is synthesized at a stage previous to the rectifier in the power receiving circuit 16. As a result, a less directional power receiving apparatus 23 can be provided. The power can be explicitly given directionality if the phase difference is adjusted to synthesize the power. More power can be received if the arrival direction of an electromagnetic wave is known.

The third embodiment has described the electromagnetic wave interface 8 using two sets of through vias and short vias. More variable or smaller directionality can be achieved by using three or more through vias, depending on the planar shape of the first conductor pattern 9. If the first conductor pattern 9 and the second conductor pattern 10 are both hexagonal, for example, three sets of through vias and short vias may be provided at three corners outside the diagonal of the first conductor pattern 9. If the first conductor pattern 9 and the second conductor pattern 10 are both octagonal, four sets of through vias and short vias may be provided at four corners outside the diagonal of the first conductor pattern 9. Accordingly, two sets of through vias and short vias can be located at any corners depending on planar shapes of the first conductor pattern 9.

The third embodiment has described the electromagnetic wave interface 8 used for power reception. The electromagnetic wave interface 8 may be used as the electromagnetic wave input port 6 for power transmission in order to promote miniaturization.

As described above, the electromagnetic wave propagation apparatus 100 according to the third embodiment decreases a resonant frequency using the capacitance between the first conductor pattern 9 and the second conductor pattern 10 and the capacitance between the planar mesh conductor 4 and both conductor patterns. Two sets of through vias and short vias are provided at the corners of the first conductor pattern 9. As a result, the electromagnetic wave interface 8 can be miniaturized and is capable of providing variable directionality and wide-band operation.

The electromagnetic wave interface 8 used for the electromagnetic wave propagation apparatus 100 according to the third embodiment can adjust the power receiving amount in accordance with the dielectric area occupancy. The positional dependence of the power receiving amount can be decreased if the planar mesh conductor 4 is shaped so as to decrease a variation in the dielectric area occupancy.

According to the third embodiment, the power receiving apparatus 23 includes the electromagnetic wave interface 8 and the power receiving circuit 16 and can be integrally mounted on a general-purpose printed substrate. Therefore, miniaturization and cost reduction can be achieved.

The third embodiment has described the electromagnetic wave propagation apparatus 100 as a power supply apparatus. The power supply station 7 and the power receiving circuit 16 may be replaced by a communication base station and a receiver, respectively. As a result, the electromagnetic wave propagation apparatus 100 can transmit an electromagnetic wave as a communication signal or a control signal between units instead of for electrical power. Other configurations and combinations can allow both signals to be transmitted simultaneously or under time sharing control. The base station 200 and the terminal 300 may each include a function of transmitting and receiving electromagnetic waves and bidirectionally exchange information.

Fourth Embodiment

The fourth embodiment of the invention will be described below.

Figure 11A:
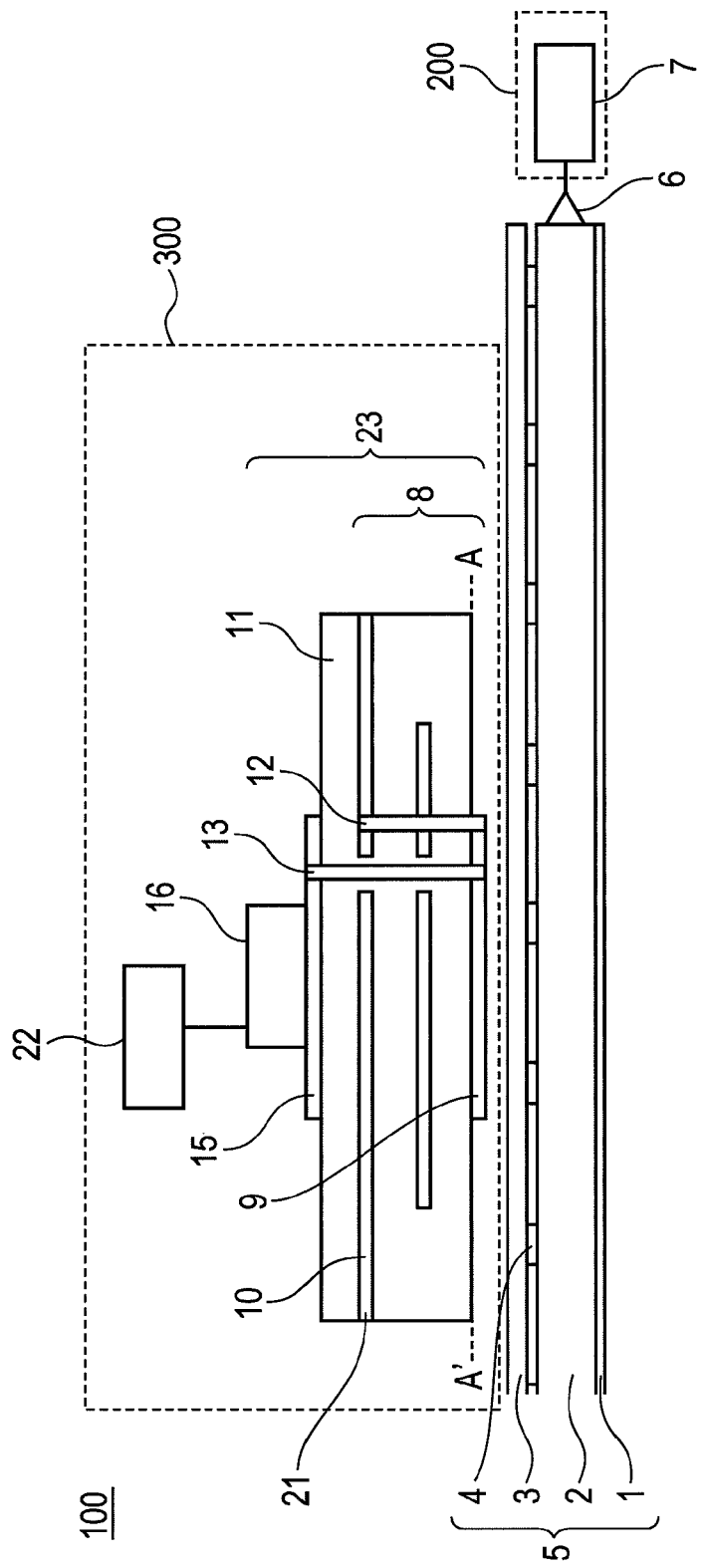
FIG. 11A is a vertical sectional view showing a configuration of an electromagnetic wave propagation apparatus according to a fourth embodiment of the invention.
Figure 11B:
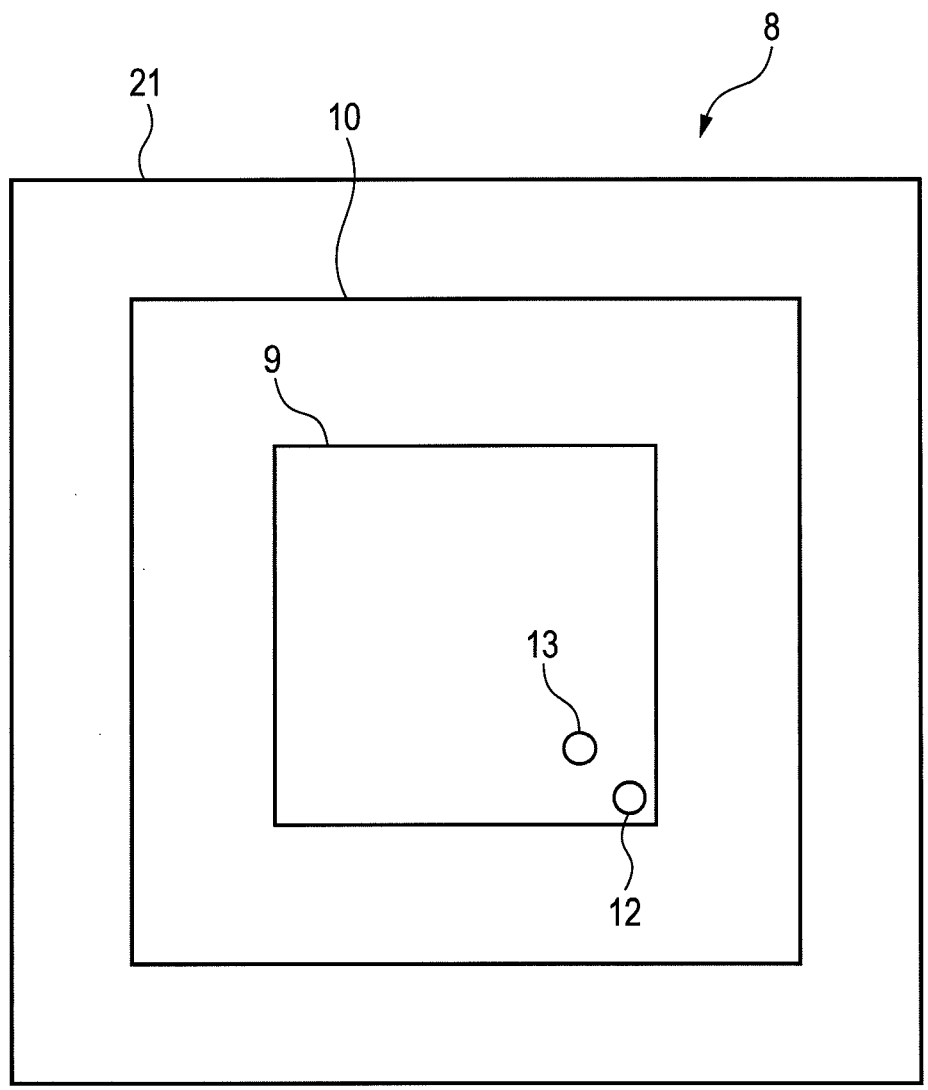
FIG. 11B shows a plane A-A' of FIG. 11A viewed from a planar propagation medium that contacts with a power receiving apparatus on the plane A-A'.

FIG. 11A is a vertical sectional view showing a configuration of the electromagnetic wave propagation apparatus 100 according to the fourth embodiment of the invention. FIG. 11B shows a plane A-A' of FIG. 11A viewed from the planar propagation medium 5 that contacts with the power receiving apparatus 23 on the plane A-A'. The electromagnetic wave propagation apparatus 100 allows the power supply station 7 to supply power to the unit 22 to be fed. The electromagnetic wave propagation apparatus 100 includes the planar propagation medium 5, the power receiving apparatus 23, and the electromagnetic wave input port 6. The power receiving apparatus 23 includes the electromagnetic wave interface 8 and the power receiving circuit 16 both provided for the dielectric substrate 11. The electromagnetic wave interface 8 includes the first conductor pattern 9, the second conductor pattern 10, a third conductor pattern 21, the short via 12, and the through via 13. To form the short via 12 and the through via 13, a drill or laser is used to bore a hole through the dielectric substrate 11. The hole is metal-plated inside.

The electromagnetic wave interface 8 enables miniaturization by decreasing a resonant frequency through the use of capacitance among the first conductor pattern 9, the second conductor pattern 10, and the third conductor pattern 21 that excite three coupling modes. The dielectric substrate 11 includes four layers of conductors. The first conductor pattern 9, the second conductor pattern 10, and the third conductor pattern 21 are formed in order from the conductor layer in contact with the planar propagation medium 5. The circuit mounting conductor 15 is formed as a layer opposite the planar propagation medium 5. The electromagnetic wave interface 8 receives power from the planar propagation medium 5. The power is fed to the power receiving circuit 16 on the circuit mounting conductor 15 through the through via 13. The power receiving circuit 16 rectifies the power. The power is transformed into a specified voltage. The power is then supplied to the unit 22.

In FIG. 11B, the first conductor pattern 9, the second conductor pattern 10, and the third conductor pattern 21 are shaped into planar squares and are electrically connected by the short via 12 provided at a corner of the first conductor pattern 9. The through via 13 is provided near the short via 12 along the diagonal of the first conductor pattern 9. The through via 13 connects the first conductor pattern 9, the second conductor pattern 10, and the third conductor pattern 21 with the power receiving circuit 16. This structure uses the short via 12 to short-circuit one of end faces. The through via 13 is provided as a power supply point along the diagonal of the first conductor pattern 9. The structure enables resonance at a low frequency. The second conductor pattern 10 functions as the ground for the first conductor pattern 9. The third conductor pattern 21 functions as the ground for the second conductor pattern 10. Therefore, the first conductor pattern 9, the second conductor pattern 10, and the third conductor pattern 21 need to be enlarged in this order for stable operation. When viewed in a direction perpendicular to the dielectric, the outline of the second conductor pattern covers the outline of the first conductor pattern. The outline of the third conductor pattern covers the outline of the second conductor pattern. The second conductor pattern 10 and the third conductor pattern 21 are also coupled with the planar propagation medium 5. The dimensions also depend on resonance conditions. The capacitance between the first conductor pattern 9 and the planar mesh conductor 4 can decrease a resonant frequency. Further miniaturization is possible. Wide-band operation is available if current path lengths are distributed over the conductor patterns for resonance. Multiple operating frequencies may be used in such a manner that multiple current paths are provided discretely or the conductor patterns are resonated at different frequencies. An input impedance for the electromagnetic wave interface 8 increases from zero to several hundreds ohms as the position of the through via 13 moves along the diagonal from the vicinity of the short via 12. Therefore, the position of the through via 13 needs to be determined in consideration of consistency with the power receiving circuit or an operating resonant frequency.

The fourth embodiment has described the electromagnetic wave interface 8 using three conductor patterns. If four or more conductor patterns are used, the electromagnetic wave interface 8 can provide much wider-band or much more operating frequencies.

According to the fourth embodiment, the short via 12 electrically connects the first conductor pattern 9, the second conductor pattern 10, and the third conductor pattern 21 in the electromagnetic wave interface 8. The operating frequency, the operating band, or the power receiving amount can be adjusted depending on which of the conductor patterns are electrically connected to each other.

The fourth embodiment has described the electromagnetic wave interface 8 used for power reception. The electromagnetic wave interface 8 may be used as the electromagnetic wave input port 6 for power transmission in order to promote miniaturization.

As described above, the electromagnetic wave propagation apparatus 100 according to the fourth embodiment decreases a resonant frequency using the capacitance among the first conductor pattern 9, the second conductor pattern 10, and the third conductor pattern 21 for exciting three coupling modes and the capacitance between the planar mesh conductor 4 and these conductor patterns. The short via 12 electrically connects these conductor patterns. The through via 13 is provided as a power supply point on the diagonal of the first conductor pattern 9. As a result, the electromagnetic wave interface 8 can be miniaturized and is capable of wide-band operation.

The electromagnetic wave interface 8 used for the electromagnetic wave propagation apparatus 100 according to the fourth embodiment can adjust the power receiving amount in accordance with the dielectric area occupancy. The positional dependence of the power receiving amount can be decreased if the planar mesh conductor 4 is shaped so as to decrease a variation in the dielectric area occupancy.

According to the fourth embodiment, the power receiving apparatus 23 includes the electromagnetic wave interface 8 and the power receiving circuit 16 and can be integrally mounted on a general-purpose printed substrate. Therefore, miniaturization and cost reduction effects can be promoted.

The fourth embodiment has described the electromagnetic wave propagation apparatus 100 as a power supply apparatus. The power supply station 7 and the power receiving circuit 16 may be replaced by a communication base station and a receiver, respectively. As a result, the electromagnetic wave propagation apparatus 100 can transmit an electromagnetic wave as a communication signal or a control signal between units, instead of use as the electrical power. Other configurations and combinations can allow both signals to be transmitted simultaneously or under time sharing control. The base station 200 and the terminal 300 may each include a function of transmitting and receiving electromagnetic waves in order to bidirectionally exchange information.

According to the first through fourth embodiments described above, the short via and the through via may be effective even at positions other than those explicitly defined herein. The short via and the through via can be effective at other positions if the positional shift amount is small enough for $\lambda g$. For example, the short via and the through via may be positioned within the range of ±10 degrees from the diagonal of the first square conductor pattern.

What is claimed is:

1. An electromagnetic wave propagation apparatus that propagates an electromagnetic wave as one of electric power and information between a base station and a terminal, the electromagnetic wave propagation apparatus comprising:
    a planar propagation medium including a planar conductor, a first planar dielectric, a planar mesh conductor, and a second planar dielectric that are stacked on each other in order;
    at least one electromagnetic wave input port that functions as a first interface to connect the base station with the planar propagation medium; and
    an electromagnetic wave interface that is provided on the second planar dielectric and functions as a second interface to connect the terminal with the planar propagation medium,
    wherein the electromagnetic wave interface includes a planar dielectric board and a plurality of planar conductor patterns disposed in parallel so as to sandwich portions of the dielectric board between adjacent ones of the conductor patterns;
    wherein the conductor patterns include a first conductor pattern that is disposed closer to the planar propagation medium than the other conductor patterns;
    wherein the first conductor pattern has a polygonal shape with at least a first corner and a second corner;

wherein a first through via is provided between the first conductor pattern and the terminal in a region proximal to the first corner of the first conductor pattern;

wherein a first short via is provided to electrically short-circuit the conductor patterns in the region proximal to the first corner of the first conductor pattern;

wherein a second through via is provided between the first conductor pattern and the terminal in a region proximal to the second corner of the first conductor pattern;

wherein the terminal includes a power receiving circuit connected to the electromagnetic wave interface; and wherein each of the first and second through vias produce reception power and the terminal is configured to synthesize the reception powers supplied with a given phase difference.

2. The electromagnetic wave propagation apparatus according to claim 1, wherein the conductor patterns include a second conductor pattern between the terminal and the first conductor pattern; and wherein, when viewed in a direction perpendicular to a top surface of the planar propagation medium, an outline of the second conductor pattern covers an outline of the first conductor pattern.

3. The electromagnetic wave propagation apparatus according to claim 2, wherein the first conductor pattern and the second conductor pattern both have square planar shapes in plan view.

4. The electromagnetic wave propagation apparatus according to claim 1, wherein the first through via is provided along a first diagonal extending from the first corner of the first conductor pattern.

5. The electromagnetic wave propagation apparatus according to claim 4, wherein the second through via is provided along a second diagonal extending from the second corner of the first conductor pattern.

6. The electromagnetic wave propagation apparatus according to claim 5, wherein:

the first short via is along the first diagonal between the first through via and the first corner, wherein a second short via is provided to electrically short-circuit the conductor patterns in the region proximal to the second corner of the first conductor pattern, and the second short via is along the second diagonal between the second through via and the second corner.

7. The electromagnetic wave propagation apparatus according to claim 1, wherein:

the first conductor pattern has a third corner, a third through via is provided between the first conductor pattern and the terminal in a region proximal to the third corner of the first conductor pattern, and the third through via is along a diagonal extending from the third corner of the first conductor pattern.

8. The electromagnetic wave propagation apparatus according to claim 1, wherein the electromagnetic wave interface includes second and third conductor patterns with a portion of the dielectric board sandwiched therebetween, the third conductor pattern is between the terminal and the first conductor pattern, and the second conductor pattern is between the first conductor pattern and the third conductor pattern;

wherein, when viewed in a direction perpendicular to a top surface of the planar propagation medium, an outline of the second conductor pattern covers an outline of the first conductor pattern and an outline of the third conductor pattern covers an outline of the second conductor pattern; and wherein the first short via electrically connects the first conductor pattern, the second conductor pattern, and the third conductor pattern together in the region proximal to the first corner of the first conductor pattern.

9. The electromagnetic wave propagation apparatus according to claim 2, wherein one of the first conductor pattern and the second conductor pattern includes a notch therein.

10. The electromagnetic wave propagation apparatus according to claim 1, wherein a circuit mounting conductor is formed as a topmost layer opposite the planar propagation medium of the electromagnetic wave interface;

wherein the first conductor pattern and the circuit mounting conductor are connected by the first and second through vias; and wherein power is received from the planar propagation medium through the electromagnetic wave interface and is transmitted to the power receiving circuit provided on the circuit mounting conductor by the first and second through vias.

11. The electromagnetic wave propagation apparatus according to claim 1, wherein one of an end face and an inside of the dielectric board is provided with one of a shield conductor and a wave absorber that shields an electromagnetic wave.

12. An electromagnetic wave interface comprising:

a planar dielectric board; and a plurality of planar conductor patterns disposed in parallel so as to sandwich portions of the dielectric board between adjacent ones of the conductor patterns and allows a terminal to perform one of input and output of an electromagnetic wave as one of power and information via a planar propagation medium, wherein the conductor patterns include a first conductor pattern disposed closer to the planar propagation medium than the other conductor patterns and a second conductor pattern between the terminal and the first conductor pattern;

wherein the first conductor pattern has a polygonal shape with at least a first corner and a second corner;

wherein a first through via is provided between the first conductor pattern and the terminal in a region proximal to the first conductor pattern;

wherein a first short via is provided to electrically short-circuit the conductor patterns in the region proximal to the first corner of the first conductor pattern;

wherein a second through via is provided between the first conductor pattern and the terminal in a region proximal to the first conductor pattern; and wherein each of the first and second through vias produce reception power and the terminal is configured to synthesize the reception powers supplied with a given phase difference.

13. The electromagnetic wave interface according to claim 12, wherein:

the first conductor pattern has a third corner, a third through via is provided between the first conductor pattern and the terminal in a region proximal to the third corner of the first conductor pattern, and the third through via is along a diagonal extending from the third corner of the first conductor pattern.

14. The electromagnetic wave interface according to claim 12,
  wherein the first conductor pattern and the second conductor pattern both have square planar shapes in plan view; and
  wherein, when viewed in a direction perpendicular to a top surface of the planar propagation medium, an outline of the second conductor pattern covers an outline of the first conductor pattern.

15. The electromagnetic wave interface according to claim 12,
  wherein the electromagnetic wave interface includes a third conductor pattern, a portion of the dielectric board sandwiched between the second and third conductor patterns, the third conductor pattern being between the terminal and the second conductor pattern;
  wherein, when viewed in a direction perpendicular to a top surface of the planar propagation medium, an outline of the second conductor pattern covers an outline of the first conductor pattern and an outline of the third conductor pattern covers an outline of the second conductor pattern; and
  wherein the first short via electrically connects the first conductor pattern, the second conductor pattern, and the third conductor pattern together in the region proximal to the first corner of the first conductor pattern.

16. The electromagnetic wave interface according to claim 12,
  wherein the first through via is provided along a first diagonal extending from the first corner of the first conductor pattern.

17. The electromagnetic wave interface according to claim 16, wherein the second through via is provided along a second diagonal extending from the second corner of the first conductor pattern.

18. The electromagnetic wave interface according to claim 17, wherein:
  the first short via is along the first diagonal between the first through via and the first corner,
  a second short via is provided to electrically short-circuit the conductor patterns in the region proximal to the second corner of the first conductor pattern, and
  the second short via is along the second diagonal between the second through via and the second corner.

* * * * *